US006557142B2

(12) United States Patent
Morris et al.

(10) Patent No.: US 6,557,142 B2
(45) Date of Patent: Apr. 29, 2003

(54) OUT-OF-BAND FORWARD ERROR CORRECTION

(75) Inventors: Russell A. Morris, Keller, TX (US); Darrell W. Barabash, Grapevine, TX (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/016,226

(22) Filed: Nov. 1, 2001

(65) Prior Publication Data

US 2002/0046381 A1 Apr. 18, 2002

Related U.S. Application Data

(62) Division of application No. 09/314,580, filed on May 18, 1999, now Pat. No. 6,330,700.

(51) Int. Cl.[7] .............................................. H03M 13/00
(52) U.S. Cl. ..................................................... 714/815
(58) Field of Search ................................. 714/815, 814, 714/55; 370/431, 442, 458, 468, 294, 313, 314, 321, 326, 327, 335, 337, 345, 347

(56) References Cited

U.S. PATENT DOCUMENTS

| | | | |
|---|---|---|---|
| 4,908,827 A | 3/1990 | Gates | 371/43 |
| 5,210,751 A | 5/1993 | Onoe et al. | |
| 5,260,987 A | 11/1993 | Mauger | 379/58 |
| 5,463,628 A | 10/1995 | Sorensen | 370/110.1 |
| 5,483,531 A | 1/1996 | Jouin et al. | 370/79 |
| 5,535,423 A | 7/1996 | Dupuy | 455/33.1 |
| 5,544,171 A | 8/1996 | Gödecker | 370/95.3 |
| 5,548,598 A | 8/1996 | Dupont | 371/35 |
| 5,557,639 A | 9/1996 | Heikkila et al. | 375/224 |
| 5,596,604 A | 1/1997 | Cioffi et al. | |
| 5,600,663 A | 2/1997 | Ayanoglu et al. | 371/41 |
| 5,615,221 A | 3/1997 | Karp et al. | 371/37.1 |
| 5,640,395 A | 6/1997 | Hamalainen et al. | 370/322 |
| 5,640,686 A | 6/1997 | Norimatsu | 455/74 |
| 5,682,403 A | 10/1997 | Tu et al. | 375/200 |
| 5,983,388 A | 11/1999 | Friedman et al. | |
| 5,987,019 A * | 11/1999 | Raith et al. | |
| 6,298,055 B1 * | 10/2001 | Wildfeuer | |
| 6,314,112 B1 * | 11/2001 | Hsu et al. | |
| 6,314,535 B1 * | 11/2001 | Morris et al. | |

* cited by examiner

Primary Examiner—Christine T. Tu
(74) Attorney, Agent, or Firm—Kenneth J. Cool

(57) ABSTRACT

A forward error correction (FEC) method is provided that operates in a multiple access format, such as, e.g., a Time Division Multiple Access (TDMA) format. An FEC transband central station and a plurality of FEC transband remote stations transmit data and corresponding error correction data therebetween during time frames. The time frames are divided into in-band time slots during which the traffic data is transmitted and out-of-band time slots during which the error correction data may be transmitted. The FEC transband remote stations that are assigned to the out-of-band time slots are efficiently and dynamically adjusted during communication.

12 Claims, 12 Drawing Sheets

| TF (#) | Gross Overhead (%) | | | Net Overhead (%) | | |
| --- | --- | --- | --- | --- | --- | --- |
| | RS 1 (33 1/3%) | RS 2 (33 1/3%) | RS 3 (33 1/3%) | RS 1 (33 1/3%) | RS 2 (33 1/3%) | RS 3 (33 1/3%) |
| 1 | 100 | 33 1/3 | 66 2/3 | 0 | 33 1/3 | 66 2/3 |
| 2 | 33 1/3 | 66 2/3 | 100 | 33 1/3 | 66 2/3 | 0 |
| 3 | 66 2/3 | 100 | 33 1/3 | 66 2/3 | 0 | 33 1/3 |
| 4 | 100 | 33 1/3 | 66 2/3 | 0 | 33 1/3 | 66 2/3 |
| 5 | 33 1/3 | 66 2/3 | 100 | 33 1/3 | 66 2/3 | 0 |
| 6 | 66 2/3 | 100 | 33 1/3 | 66 2/3 | 0 | 33 1/3 |
| 7 | 100 | 33 1/3 | 66 2/3 | 0 | 33 1/3 | 66 2/3 |
| 8 | 33 1/3 | 66 2/3 | 100 | 33 1/3 | 66 2/3 | 0 |
| 9 | 66 2/3 | 100 | 33 1/3 | 66 2/3 | 0 | 33 1/3 |

Fig. 8

| TF (#) | Gross Overhead (%) | | | Net Overhead (%) | | |
| --- | --- | --- | --- | --- | --- | --- |
| | RS 1 (20%) | RS 2 (20%) | RS 3 (20%) | RS 1 (20%) | RS 2 (20%) | RS 3 (20%) |
| 1 | 60 | 20 | 40 | 0 | 20 | 40 |
| 2 | 20 | 40 | 60 | 20 | 40 | 0 |
| 3 | 40 | 60 | 20 | 40 | 0 | 20 |
| 4 | 60 | 20 | 40 | 0 | 20 | 40 |
| 5 | 20 | 40 | 60 | 20 | 40 | 0 |
| 6 | 40 | 60 | 20 | 40 | 0 | 20 |
| 7 | 60 | 20 | 40 | 0 | 20 | 40 |
| 8 | 20 | 40 | 60 | 20 | 40 | 0 |
| 9 | 40 | 60 | 20 | 40 | 0 | 20 |

Fig. 9

|   | Gross Overhead (%) | | | Net Overhead (%) | | |
|---|---|---|---|---|---|---|
| TF (#) | RS 1 (20%) | RS 2 (50%) | RS 3 (10%) | RS 1 (20%) | RS 2 (50%) | RS 3 (10%) |
| 1 | 20 | 50 | 10 | 20 | 0 | 10 |
| 2 | 40 | 50 | 20 | 40 | 0 | 20 |
| 3 | 60 | 50 | 30 | 0 | 50 | 30 |
| 4 | 20 | 100 | 40 | 20 | 0 | 40 |
| 5 | 40 | 50 | 50 | 40 | 50 | 0 |
| 6 | 60 | 100 | 10 | 60 | 0 | 10 |
| 7 | 80 | 50 | 20 | 0 | 50 | 20 |
| 8 | 20 | 100 | 30 | 20 | 0 | 30 |
| 9 | 40 | 50 | 40 | 40 | 0 | 40 |
| 10 | 60 | 50 | 50 | 0 | 50 | 50 |
| 11 | 20 | 100 | 60 | 20 | 0 | 60 |
| 12 | 40 | 50 | 70 | 40 | 50 | 0 |
| 13 | 60 | 100 | 10 | 60 | 0 | 10 |
| 14 | 80 | 50 | 20 | 0 | 50 | 20 |
| 15 | 20 | 100 | 30 | 20 | 0 | 30 |
| 16 | 40 | 50 | 40 | 40 | 0 | 40 |
| 17 | 60 | 50 | 50 | 0 | 50 | 50 |
| 18 | 20 | 100 | 60 | 20 | 0 | 60 |
| 19 | 40 | 50 | 70 | 40 | 50 | 0 |

Fig. 10

|  | Gross Overhead (%) | | | | Net Overhead (%) | | | |
|---|---|---|---|---|---|---|---|---|
|  | RS 1 | RS 2 | RS 3 | RS 4 | RS 1 | RS 2 | RS 3 | RS 4 |
| TF (#) | (20%) | (50%) | (10%) | (20%) | (20%) | (50%) | (10%) | (20%) |
| 1 | 20 | 50 | 10 | X | 20 | 0 | 10 | X |
| 2 | 40 | 50 | 20 | X | 40 | 0 | 20 | X |
| 3 | 60 | 50 | 30 | X | 0 | 50 | 30 | X |
| 4 | 20 | 100 | 40 | X | 20 | 0 | 40 | X |
| 5 | 40 | 50 | 50 | X | 40 | 50 | 0 | X |
| 6 | 60 | 100 | 10 | X | 60 | 0 | 10 | X |
| 7 | 80 | 50 | 20 | X | 0 | 50 | 20 | X |
| 8 | 20 | 100 | 30 | X | 20 | 0 | 30 | X |
| 9 | 40 | 50 | 40 | X | 40 | 0 | 40 | X |
| 10 | 60 | 50 | 50 | X | 0 | 50 | 50 | X |
| 11 | 20 | 100 | 40 | X | 20 | 0 | 40 | X |
| 12 | 40 | 50 | 50 | X | 40 | 50 | 0 | X |
| 13 | 60 | 100 | 10 | X | 60 | 0 | 10 | X |
| 14 | 80 | 50 | 20 | X | 0 | 50 | 20 | X |
| 15 | 20 | 100 | 30 | X | 20 | 0 | 30 | X |
| 16 | 40 | 50 | 40 | X | 40 | 0 | 40 | X |
| 17 | 60 | 50 | 50 | X | 0 | 50 | 50 | X |
| 18 | 20 | 100 | 40 | X | 20 | 0 | 40 | X |
| 19 | 40 | 50 | 50 | X | 40 | 50 | 0 | X |
| 20 | 60 | 100 | 10 | 20 | 60 | 0 | 10 | 20 |
| 21 | 80 | 50 | 20 | 40 | 0 | 50 | 20 | 40 |
| 22 | 20 | 100 | 30 | 60 | 20 | 0 | 30 | 60 |
| 23 | 40 | 50 | 40 | 80 | 40 | 50 | 40 | 0 |
| 24 | 60 | 100 | 50 | 20 | 60 | 0 | 50 | 20 |
| 25 | 80 | 50 | 60 | 40 | 0 | 50 | 60 | 40 |
| 26 | 20 | 100 | 70 | 60 | 20 | 0 | 70 | 60 |
| 27 | 40 | 50 | 80 | 80 | 40 | 50 | 0 | 80 |
| 28 | 60 | 100 | 10 | 100 | 60 | 100 | 10 | 0 |
| 29 | 80 | 150 | 20 | 20 | 80 | 50 | 20 | 20 |
| 30 | 100 | 100 | 30 | 40 | 0 | 100 | 30 | 40 |
| 31 | 20 | 150 | 40 | 60 | 20 | 50 | 40 | 60 |
| 32 | 40 | 100 | 50 | 80 | 40 | 0 | 50 | 80 |
| 33 | 60 | 50 | 60 | 100 | 60 | 50 | 60 | 0 |
| 34 | 80 | 100 | 70 | 20 | 80 | 0 | 70 | 20 |
| 35 | 100 | 50 | 80 | 40 | 0 | 50 | 80 | 40 |
| 36 | 20 | 100 | 90 | 60 | 20 | 0 | 90 | 60 |
| 37 | 40 | 50 | 100 | 80 | 40 | 50 | 0 | 80 |
| 38 | 60 | 100 | 10 | 100 | 60 | 0 | 10 | 100 |
| 39 | 80 | 150 | 20 | 20 | 80 | 50 | 20 | 20 |
| 40 | 100 | 100 | 30 | 40 | 0 | 100 | 30 | 40 |
| 41 | 20 | 150 | 40 | 60 | 20 | 50 | 40 | 60 |
| 42 | 40 | 100 | 50 | 80 | 40 | 0 | 50 | 80 |
| 43 | 60 | 50 | 60 | 100 | 60 | 50 | 60 | 0 |
| 44 | 80 | 100 | 70 | 20 | 80 | 0 | 70 | 20 |
| 45 | 100 | 50 | 80 | 40 | 0 | 50 | 80 | 40 |
| 46 | 20 | 100 | 90 | 60 | 20 | 0 | 90 | 60 |
| 47 | 40 | 50 | 100 | 80 | 40 | 50 | 0 | 80 |

Fig. 11

| TF (#) | Gross Overhead (%) | | | Net Overhead (%) | | |
|---|---|---|---|---|---|---|
| | RS 1 (20%) | RS 2 (50%) | RS 3 (10%) | RS 1 (20%) | RS 2 (50%) | RS 3 (10%) |
| 1 | 20 | 50 | 10 | 20 | 0 | 10 |
| 2 | 40 | 50 | 20 | 40 | 0 | 20 |
| 3 | 60 | 50 | 30 | 0 | 50 | 30 |
| 4 | 20 | 100 | 40 | 20 | 0 | 40 |
| 5 | 40 | 50 | 50 | 40 | 0 | 0 |
| 6 | 60 | 100 | 10 | 60 | 50 | 10 |
| 7 | 80 | 50 | 20 | 0 | 50 | 20 |
| 8 | 20 | 100 | 30 | 20 | 0 | 30 |
| 9 | 40 | 50 | 40 | 40 | 0 | 40 |
| 10 | 60 | 50 | 50 | 0 | 50 | 50 |
| 11 | 20 | 100 | 40 | 20 | 0 | 40 |
| 12 | 40 | 50 | 50 | 40 | 0 | 0 |
| 13 | 60 | 100 | 10 | 60 | 50 | 10 |
| 14 | 80 | 50 | 20 | 0 | 50 | 20 |
| 15 | 20 | 100 | 30 | 20 | 0 | 30 |
| 16 | 40 | 50 | 40 | 40 | 0 | 40 |
| 17 | 60 | 50 | 50 | 0 | 50 | 50 |
| 18 | 20 | 100 | 40 | 20 | 0 | 40 |
| 19 | 40 | 50 | 50 | 40 | 50 | 0 |
| 20 | 60 | 100 | x | 60 | 100 | x |
| 21 | 80 | 50 | x | 80 | 50 | x |
| 22 | 20 | 100 | x | 20 | 100 | x |
| 23 | 40 | 50 | x | 40 | 50 | x |
| 24 | 60 | 50 | x | 60 | 50 | x |
| 25 | 20 | 100 | x | 20 | 100 | x |
| 26 | 40 | 50 | x | 40 | 50 | x |
| 27 | 60 | 50 | x | 60 | 50 | x |

Fig. 12

| TF (#) | Gross Overhead (%) | | | Net Overhead (%) | | |
|---|---|---|---|---|---|---|
| | RS 1 (20%) | RS 2 (50%)>(20%) | RS 3 (10%) | RS 1 (20%) | RS 2 (50%) | RS 3 (10%) |
| 1 | 20 | <u>50</u> | 10 | 20 | 0 | 10 |
| 2 | 40 | <u>50</u> | 20 | 40 | 0 | 20 |
| 3 | <u>60</u> | 50 | 30 | 0 | 50 | 30 |
| 4 | 20 | <u>100</u> | 40 | 20 | 0 | 40 |
| 5 | 40 | 50 | <u>50</u> | 40 | 50 | 0 |
| 6 | 60 | <u>100</u> | 10 | 60 | 0 | 10 |
| 7 | <u>80</u> | 50 | 20 | 0 | 50 | 20 |
| 8 | 20 | <u>100</u> | 30 | 20 | 0 | 30 |
| 9 | 40 | <u>50</u> | 40 | 40 | 0 | 40 |
| 10 | <u>60</u> | 50 | 50 | 0 | 50 | 50 |
| 11 | 20 | <u>100</u> | 40 | 20 | 0 | 40 |
| 12 | 40 | 50 | <u>50</u> | 40 | 50 | 0 |
| 13 | 60 | <u>100</u> | 10 | 60 | 0 | 10 |
| 14 | <u>80</u> | 50 | 20 | 0 | 50 | 20 |
| 15 | 20 | <u>100</u> | 30 | 20 | 0 | 30 |
| 16 | 40 | <u>50</u> | 40 | 40 | 0 | 40 |
| 17 | <u>60</u> | 50 | 50 | 0 | 50 | 50 |
| 18 | 20 | <u>100</u> | 40 | 20 | 0 | 40 |
| 19 | 40 | 50 | <u>50</u> | 40 | 50 | 0 |
| 20 | 60 | <u>70</u> | 10 | 60 | 0 | 10 |
| 21 | <u>80</u> | 20 | 20 | 0 | 20 | 20 |
| 22 | 20 | <u>40</u> | 30 | 20 | 0 | 30 |
| 23 | 40 | 20 | <u>40</u> | 40 | 20 | 0 |
| 24 | <u>60</u> | 40 | 10 | 0 | 40 | 10 |
| 25 | 20 | <u>60</u> | 20 | 20 | 0 | 20 |
| 26 | <u>40</u> | 20 | 30 | 0 | 20 | 30 |
| 27 | 20 | 40 | <u>40</u> | 20 | 40 | 0 |
| 28 | 40 | <u>60</u> | 10 | 40 | 0 | 10 |
| 29 | <u>60</u> | 20 | 20 | 0 | 20 | 20 |
| 30 | 20 | <u>40</u> | 30 | 20 | 0 | 30 |
| 31 | 40 | 20 | <u>40</u> | 40 | 20 | 0 |
| 32 | <u>60</u> | 40 | 10 | 0 | 40 | 10 |
| 33 | 20 | <u>60</u> | 20 | 20 | 0 | 20 |
| 34 | <u>40</u> | 20 | 30 | 0 | 20 | 30 |
| 35 | 20 | 40 | <u>40</u> | 20 | 40 | 0 |
| 36 | 40 | <u>60</u> | 10 | 40 | 0 | 10 |
| 37 | <u>60</u> | 20 | 20 | 0 | 20 | 20 |

Fig. 13

OUT-OF-BAND FORWARD ERROR CORRECTION

RELATED APPLICATION

The present application is a divisional of co-pending U.S. patent application Ser. No. 09/314,580, entitled OUT-OF-BAND FORWARD ERROR CORRECTION, filed on May 18, 1999 now U.S. Pat. No. 6,330,700, which is incorporated herein by reference in its entirety.

FIELD OF THE INVENTION

The present invention pertains to the field of error correction in communication systems, including more specifically, forward error correction schemes.

BACKGROUND OF THE INVENTION

Digital communications systems utilize communication channels over which traffic data is communicated or transported. These channels are typically bandwidth limited, having a finite channel capacity. The channel capacity together with other properties of the channel, such as various forms of noise and interference, will, with statistical certainty, cause, or otherwise result, in the injection of error conditions in the traffic data communicated over the channel. The effects of these error conditions may be particularly evident in wireless communications systems, which utilize generally unpredictable over-the-air communications channels through which remote stations communicate with a central station.

A technique for eliminating, or at least reducing, the effects of these error conditions is called Forward Error Correction (FEC). In general, the employment of an FEC technique entails transmitting error detection data and error correction data along with the bearer data. The error detection data and error correction data are typically derived from the bearer data itself by employing an error detection algorithm and error correction algorithm known to the receiver as well as the transmitter, and in the case of a digital wireless communications system, a remote station and a central station in communication with one another.

FEC techniques have been employed in Time Division Multiple Access (TDMA) wireless communications systems. TDMA systems typically allow communication between a plurality of remote stations and a central station using the same frequency band and transmitting bearer data between remote stations and the central station during discrete time periods (i.e., each remote station transmits and receives bearer data broken up into bearer data bursts during respective time slots of cyclically repeating time frames).

In a known wireless communication, prior to transmission, the central station or remote station appends or encodes the bearer data with error detection data and error correction data according to a respective error detection algorithm and error correction algorithm. The reciprocal remote station or central station receives each error correctable bearer data packet, automatically corrects any errors in each error correctable bearer data packet (within the limits of the error correction algorithm) by processing the error correctable bearer data packet according to the error correction algorithm, and detects any residual errors in each corrected error correctable bearer data packet by processing the corrected error correctable bearer data packet according to the error detection algorithm.

The use of an FEC technique to eliminate or reduce the effects of transmission errors, however, does not come without a cost to the communications system. The transmission bandwidth available to a user transmitting in a particular time slot in known systems is reduced by the overhead required to transmit the additional data, and in particular, the error correction data. The transmission of error correction data with each error correctable bearer data packet may require 100% or more overhead in some instances. This increase in overhead typically results in a reduction in the bandwidth available for the traffic data (for a fixed transmission bit rate per user).

In known wireless communications systems, the Bit Error Rate (BER) of the traffic data communicated between a central station and a remote station depends on dynamically varying conditions, such as, the relative distance between the remote station and the central station, environmental conditions, traffic data transmission rate, etc. In one system, a description of which is described in an application filed concurrently herewith, which is hereby expressly and fully incorporated herein by reference, the amount of error correction data is varied in accordance with the BER to more efficiently utilize the resources of the system. In such a case, the amount of bearer data contained in the error correctable bearer data packet transmitted and received over a particular time slot may vary. As a result, management of the bearer data can become more difficult resulting in a more complex system, and the data rate provided to the user dynamically varies with channel conditions. Many systems reserve bandwidth to accommodate peak requirements, resulting in wasted bandwidth during normal conditions.

There thus is a need for a communications system that employs an FEC scheme that results in transmission of error correctable bearer data blocks with a uniform amount of bearer data, allowing use of available unused capacity for FEC data (i.e., improving the overall throughput system usage), while still providing high quality communication.

Other preferred methods may comprise respectively transmitting bearer data and error correction data in different frequency bands (FDMA), or using different codes (CDMA), or using any other orthogonal mechanism.

SUMMARY OF THE INVENTION

The present inventions comprise a novel method of transmitting and receiving bearer information and error correction information associated with the bearer information in different logical channels.

A preferred method of the present inventions comprises a wireless communication system having a plurality of FEC transband remote stations that communicate with an FEC transband central station during a plurality of time frames. Each time frame of the plurality of time frames is divided into a plurality of time slots. The time slots include in-band time slots and out-of-band time slots, which are preferably, non-dedicated in that a particular time slot can be employed as either an in-band time slot or an out-of-band time slot during any given time frame. At least one FEC transband remote station transmits and/or receives bearer data packets during an in-band time slot of the plurality of time frames. The at least one FEC transband remote station transmits and/or receives an error correction data packet corresponding to at least one of the transmitted and/or received bearer data packets during at least one out-of-band time slot of the plurality of time frames. Some of these FEC transband remote stations can transmit and/or receive error correction data packets during sub-out-of-band time slots, i.e., they share an out-of-band time slot over a plurality of time frames.

The transmission of bearer data and error correction data between the plurality of FEC transband remote stations and the FEC transband central station creates a system data overhead, which varies when an FEC transband remote station is initiated, terminated, or as the error correction data overhead rating of an FEC transband remote station is altered. Assignment of the plurality of FEC transband remote stations to in-band time slots and out-of-band time slots can be characterized as a remote station assignment combination, which is dynamically modified as the system data overhead changes.

BRIEF DESCRIPTION OF THE DRAWINGS

FIGS. 8, 9, and 10 are tables illustrating various error correction data accumulation and error correction data transmission orders of three FEC transband remote stations that share an out-of-band time slot over a plurality of time frames;

FIG. 11 is a table illustrating the error correction data accumulation and error correction data transmission order of four remote stations, which include an initiating FEC transband remote station, that share an out-of-band time slot over a plurality of time frames;

FIG. 12 is a table illustrating the error correction data accumulation and error correction data transmission order of three FEC transband remote stations, which include a terminating FEC transband remote station, that share an out-of-band time slot over a plurality of time frames; and FIG. 13 is a table illustrating the error correction data accumulation and error correction data transmission order of three FEC transband remote stations, which include an FEC transband remote station of which the error correction data overhead rating is altered, that share an out-of-band time slot over a plurality of time frames.

DETAILED DESCRIPTION OF THE PREFERRED EMBODIMENTS

Figure 1:
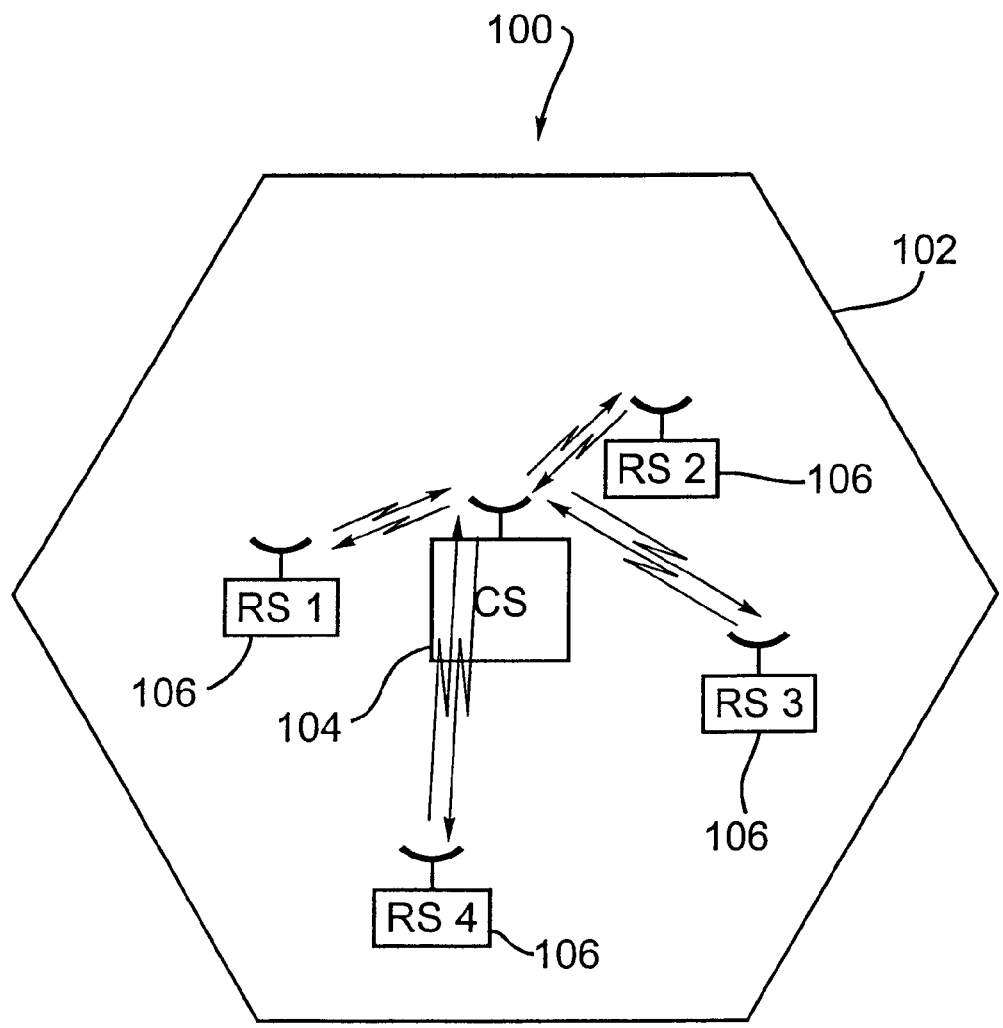
FIG. 1 is a representative block diagram of a wireless communication system cell showing an FEC transband central station communicating with a plurality of FEC transband remote stations.

FIG. 1 depicts a TDMA wireless communication system 100 arranged to operate in accordance with a preferred embodiment of the present inventions. An FEC transband central station 104 is depicted as communicating with respective FEC transband remote stations 106 within a cell 102. The cell 102 can be a macro-cell, micro-cell, wireless local loop, or any network in which multiple communication devices can communicate with one another. The FEC transband central station 104 can be a base station, base station processor, mobile switching center, or any communication device that can communicate with multiple remote stations. The FEC transband remote stations 106 can be any combination of mobile handsets and wireless local loop terminals.

The FEC transband central station 104 and respective FEC transband remote stations 106 communicate in a Time Division Multiple Access/Frequency Division Duplex (TDMA/FDD) format. That is, respective communications between the FEC transband central station 104 and each of the FEC transband remote stations 106 are time isolated, and the downlink communication between the FEC transband central station 104 and a particular FEC transband remote station 106 is frequency isolated from the uplink communication between the FEC transband central station 104 and that particular FEC transband remote station 106. The FEC transband central station 104 transmits data to the FEC transband remote stations 106 over a single downlink frequency, such as, 1960 MHZ, and the FEC transband remote stations 106 transmit data to the FEC transband central station 104 over a single uplink frequency, such as, 1880 MHZ. It should be noted that the invention is not to be limited to TDMA/FDD.

Figure 2:
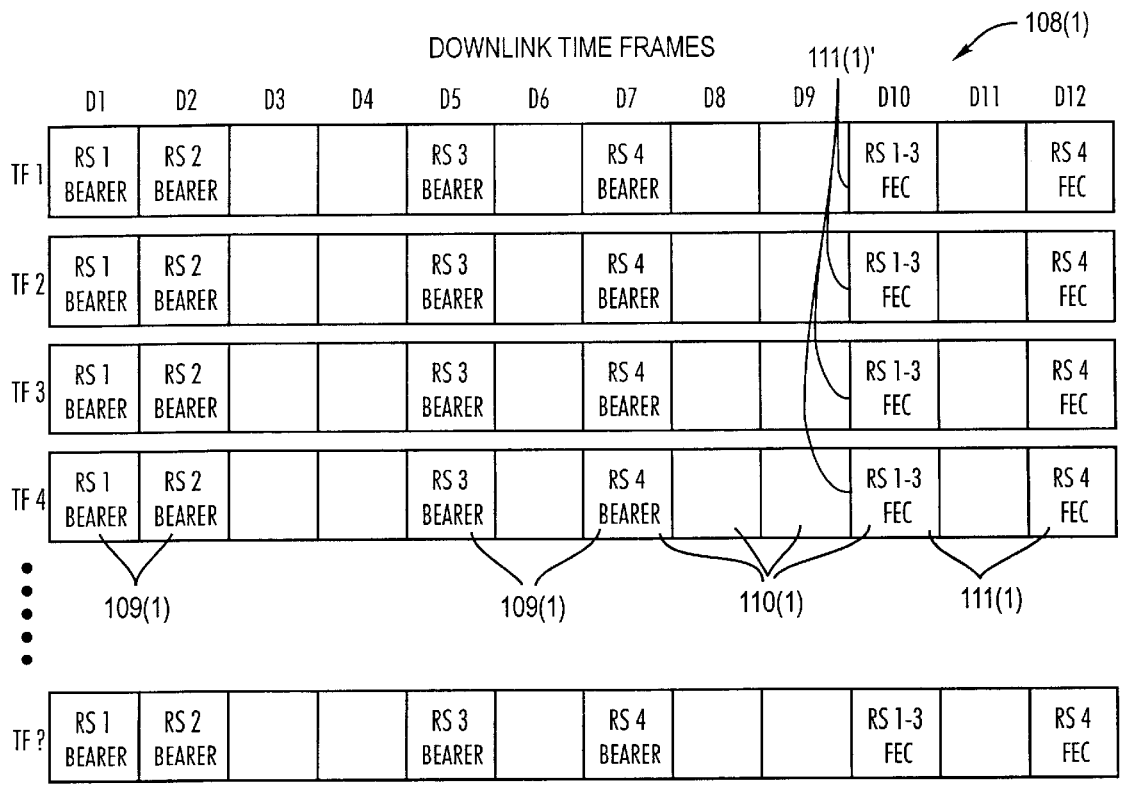
FIG. 2 depicts TDMA/FDD formatted downlink time frames and uplink time frames divided into a plurality of unused time slots, in-band time slots, and out-of-band time slots.
Figure 2:
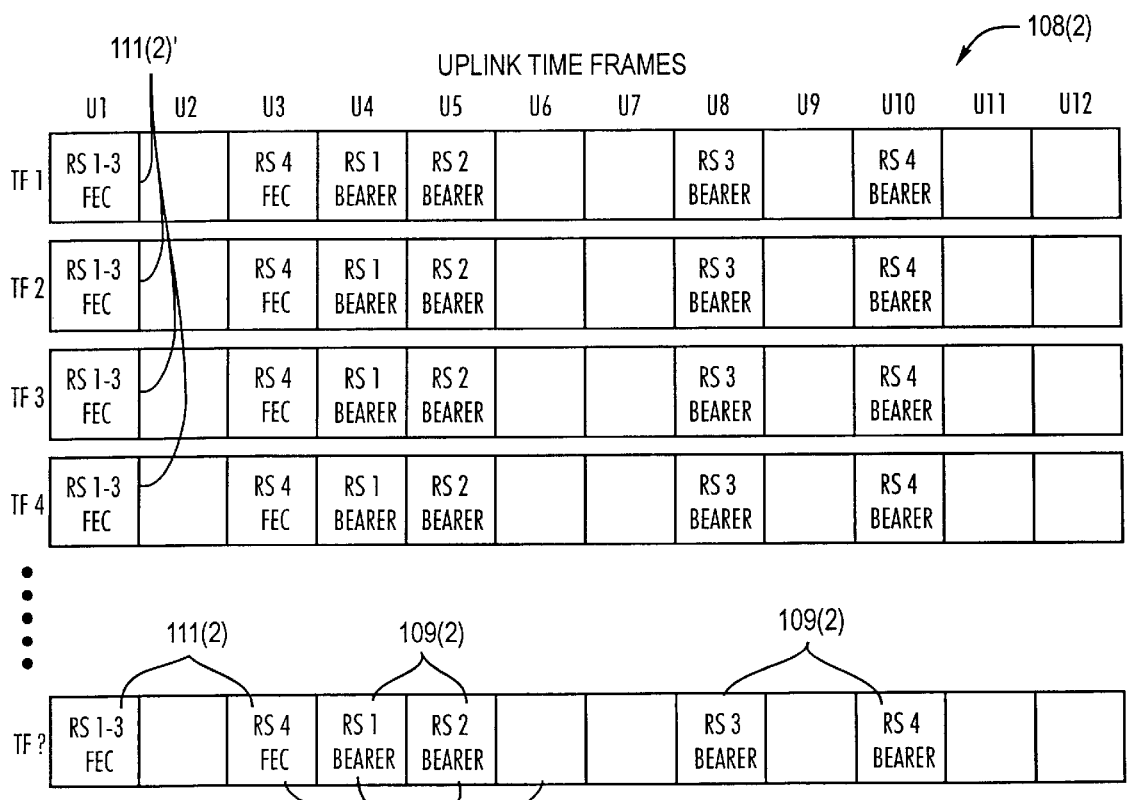

As shown in FIG. 2, the downlink frequency is divided into cyclically repeating downlink time frames 108(1), and the uplink frequency is divided into cyclically repeating uplink time frames 108(2) (collectively referred to hereinafter as time frame pairs 108(1)/(2)). The time frame pairs 108(1)/(2) are further divided into respective sets of downlink time slots 110(1) and uplink time slots 110(2) (collectively referred to hereinafter as time slot pairs 110(1)/(2)). The uplink time frames 108(2) are synchronized with the downlink time frames 108(1). The downlink time slots 110(1) are used as either downlink in-band time slots 109(1) or downlink out-of-band time slots 111(1). The uplink time slots 110(2) are used as either uplink in-band time slots 109(2) or uplink out-of-band time slots 111(2). The downlink in-band time slots 109(1) and uplink in-band time slots 109(2) (collectively referred to hereinafter as in-band time slot pairs 109(1)/(2)) and the uplink out-of-band time slots 111(1) and downlink out-of-band time slots 111(2) (collectively referred hereinafter as out-of-band time slot pairs 111(1)/(2)) are non-dedicated in that each of the time slot pairs 110(1)/(2) can be used as either in-band time slot pairs 109(1)/(2) or out-of-band time slot pairs 111(1)/(2) during any given time frame pair 108(1)/(2). It should be noted that the term "pair" when used to group a particular downlink time frame 108(1) with a particular uplink time frame 108(2), or a particular downlink time slot 110(1) with a particular uplink time slot 110(2), does not connote symmetry within the time frame pair 108(1)/(2).or time slot pair 110(1)/(2).

The FEC transband remote stations 106 are respectively assigned to downlink in-band time slots 109(1) during which they respectively receive bearer data packets from the FEC transband central station 104 (in this case, time slots D1, D2, D5, and D7 for respective FEC transband remote stations 1–4). The FEC transband remote stations 106 are respectively assigned to uplink in-band time slots 109(2) during which they respectively transmit bearer data packets to the FEC transband central stations (in this case, time slots U4, U5, U8, and U10 for respective FEC transband remote stations 104). As can be seen, several time slots of delay, and in this case three, can be induced between corresponding downlink time slots 110(1) and uplink time slots 110(2) to obviate the need for installing additional hardware in the FEC transband remote stations 106. It should be noted that, even given the several time slots of delay, if a remote station 106 transmits bearer data and receives error correction data, or vice versa, in the same time slots (such as, e.g., remote station 1 transmits bearer data in time slot D1 and receives error correction data in time slot U1), this remote station would need additional hardware. In general, however, the system can be configured, such that this will not occur. Depending on the particular protocol of the system, the unused time slot pairs 110(1)/(2) are idle time slots that can be used by other FEC transband remote stations 106, or alternatively, to support various other functions, such as transmission of control data between the FEC transband central station 104 and the FEC transband remote stations 106 or transmission of broadcast data from the FEC transband central station 104.

The FEC transband remote stations 106 are respectively assigned to downlink out-of-band time slots 111(1) during which they receive error correction data packets from the FEC transband central station (in this case, time slot D10 for respective FEC transband remote stations 1–3 and time slot D12 for FEC transband remote station 12). As is apparent from FIG. 2, more than one FEC transband remote station 106 can receive error correction data packets during a single downlink out-of-band time slot 111(1) by further dividing the downlink out-of-band time slot 111(1) into downlink sub-out-of-band time slots 111(1)'. That is, each FEC transband remote station 106 that receives an error correction data packet during a downlink out-of-band time slot 111(1) does not receive an error correction data packet during every downlink time frame 108(1), but rather shares the downlink out-of-band time slot 111(1) over several downlink time frames 108(1) with other FEC transband remote stations 106, such as is the case with time slot D10.

The FEC transband remote stations 106 are respectively assigned to uplink out-of-band time slots 111(2) during which they respectively transmit error correction data packets to the FEC transband central station 104 (in this case, time slots U1 for respective FEC transband remote stations 1–3 and time slot U3 for FEC transband remote station 4). As with the downlink out-of-band time slots 111(1), the uplink out-of-band time slots 111(2) can be divided into uplink sub-out-of-band time slots 111(2)', if necessary, such as is the case with time slot U1.

As the bearer data packets are not encoded with error correction data, the in-band time slot pairs 109(1)/(2) need not support error correction data overhead, and the amount of bearer data in each bearer data packet remains uniform from timing window to timing window, even as the FEC overhead and the out-of-band bit rate varies.

Figure 3:
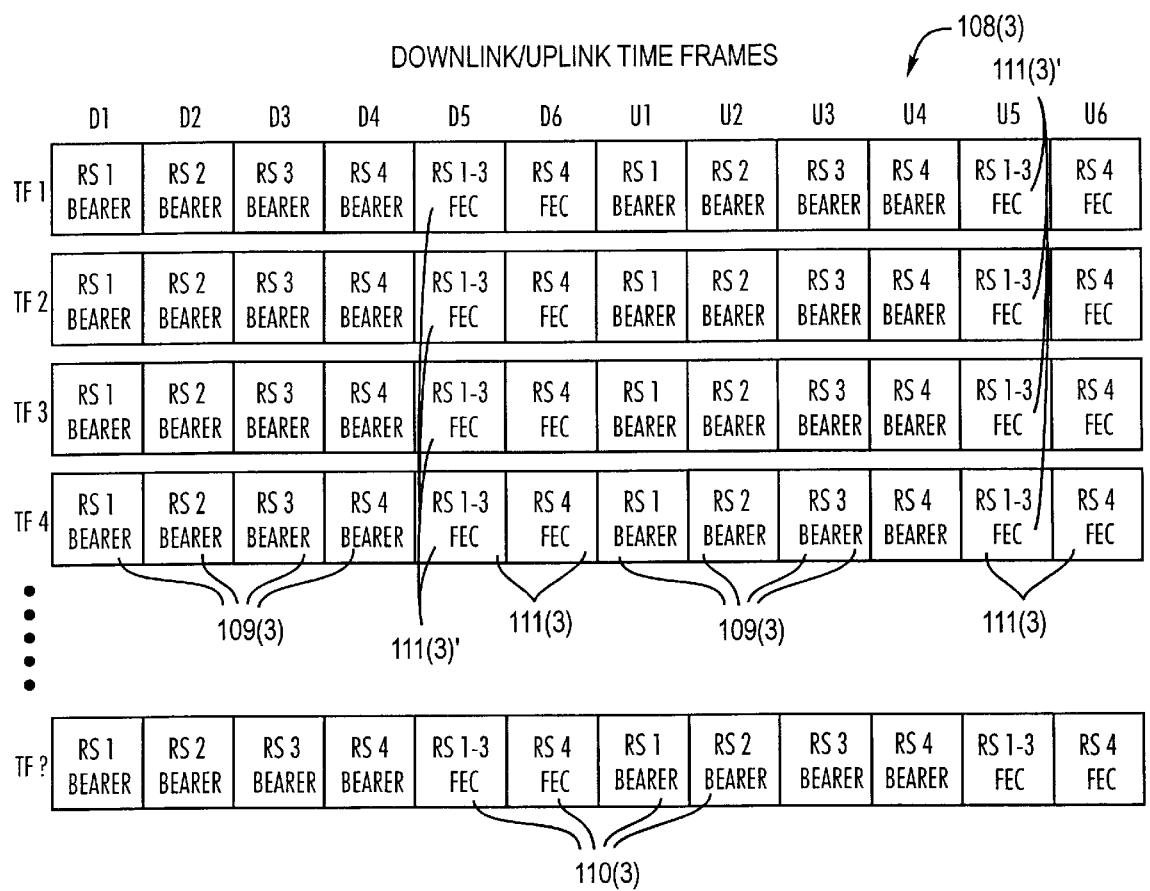
FIG. 3 depicts TDMA/TDD formatted downlink/uplink time frames divided into a plurality of unused time slots, in-band time slots, and out-of-band time slots.

Alternatively, the wireless communications system 100 is configured in a Time Division Multiple Access/Time Division Duplex (TDMA/TDD) format, wherein a single frequency is utilized for both downlink and uplink transmission of bearer data, and the downlink communication between the FEC transband central station 104 and a particular FEC transband remote station 106 is time isolated from the uplink communication between the FEC transband central station 104 and that particular FEC transband remote station 106. As shown in FIG. 3, the downlink/uplink frequency is divided into cyclically repeating time frames 108(3), which are further divided into time slots 110(3). Half of the time slots 110(3) are dedicated to downlink transmissions of data, and half of the time slots 110(3) are dedicated to uplink transmissions of data. It should be noted that the amount of downlink time slots 110(3) and the number of uplink time slots 110(3) can be unequal.

Each FEC transband remote station 106 is assigned in-band time slots 110(3) during which it can respectively receive downlink bearer data packets from the FEC transband central station 104 and transmit uplink bearer data packets to the FEC transband central station 104 (in this case, time slots (D1,U1), (D2,U2), (D3,U3), and (D4,U4) for respective FEC transband remote stations 1–4). Each FEC transband remote station 106 is assigned out-of-band time slots 110(3) during which it can respectively receive downlink error correction data packets from the FEC transband central station 104 and transmit uplink error correction data packets to the FEC transband central station 104 (in this case, time slots (D5,U5) for respective FEC transband remote stations 1–3 and time slots (D6,U6) for FEC transband remote station 4).

Although FIG. 1 depicts only four FEC transband remote stations 106 in communication with the FEC transband central station 104 over a single frequency pair (TDMA/FDD) or single frequency (TDMA/TDD), in reality, the FEC transband central station 104 simultaneously communicates with many other FEC transband remote stations 106 over a broad range of frequencies or frequency pairs.

With respect to both TDMA types, the proportion of sub-out-of-band time slots 111' of an out-of-band time slots 111 during which a particular FEC transband remote station 106 either transmits or receives error correction data packets is based on the amount of overhead (expressed as a ratio of error correction data to bearer data) required for each of these FEC transband remote stations 106 to either transmit or receive an error correction data packet.

For instance, referring to FIG. 3, if each of FEC transband remote stations 1–3 requires 33⅓% overhead to receive error correction data corresponding to one bearer data packet (33⅓% overhead rating) from the FEC transband central station 104, each of the FEC transband remote stations 1–3 receives during sub-out-of-band time slots 111(1)' 33⅓% of the total error correction data received during the downlink out-of-band time slot 111(1). That is, each of the FEC transband remote stations 1–3 receives error correction data representing 100% overhead in every third out-of-band time slot D5. On the other hand, if FEC transband remote stations 1–3 respectively have a 25%, 50%, and 25% overhead rating, each of the FEC transband remote stations 1–3 respectively receive during sub-out-of-band time slots 111(1)' 25%, 50%, and 25% of the total error correction data received during the downlink out-of-band time slot 111(1). That is, each of the FEC transband remote stations 1 and 3 receives error correction data representing 100% overhead in every fourth out-of-band time slot D5, and FEC transband remote station 2 receives bearer data representing 100% overhead in every other out-of-band time slot D5.

It should be noted that the maximum overhead supported by an out-of-band time slot 111, irrespective of whether the out-of-band time slot 111 is further divided into sub-out-of-band time slots 111, cannot exceed 100%. That is, the total overhead of the error correction data associated with the transmission or reception of a bearer data packet by the FEC transband remote station(s) 106 that employ the out-of-band time slot 111 cannot exceed 100% per out-of-band time slot 111. For instance, with respect to FIG. 3, the amount error correction data overhead transmitted or received by FEC transband remote station 4 cannot exceed 100%, and the total amount of error correction data overhead transmitted or received by FEC transband remote stations 1–3 cannot exceed 100%. For example, the respective overhead ratings of FEC transband remote stations 1–3 can be 33⅓%, 33⅓%, and 33⅓%, which adds to 100%; or 25%, 50%, and 25%, which also adds to 100%. It should be noted that it is possible for the overhead rating of a particular FEC transband remote stations 106 to exceed 100%, in which case, it would be necessary to utilize more than one out-of-band time slot 111 to transmit such error correction data.

Although it is sometimes efficient to maximize the error correction data transmitted or received during the out-of-band time slot 111, there is no requirement that the overhead rating of an FEC transband remote station that solely uses a particular out-of-band time slot 111, or the combined overhead ratings of any FEC transband remote stations that share a particular out-of-band time slot 111, be 100%. As shown in further detail below, there are some instances in which the combined overhead rating of a particular out-of-band time slot 111 cannot equal 100% given the particular overhead ratings of the FEC transband remote stations.

It should also be noted that the in-band time slots 109 and the out-of-band time slots 111 are not dedicated in that the character of any time slot 110 depends on the particular needs of the wireless communications system 100 at any given time, and thus may be time varying.

Figure 4:
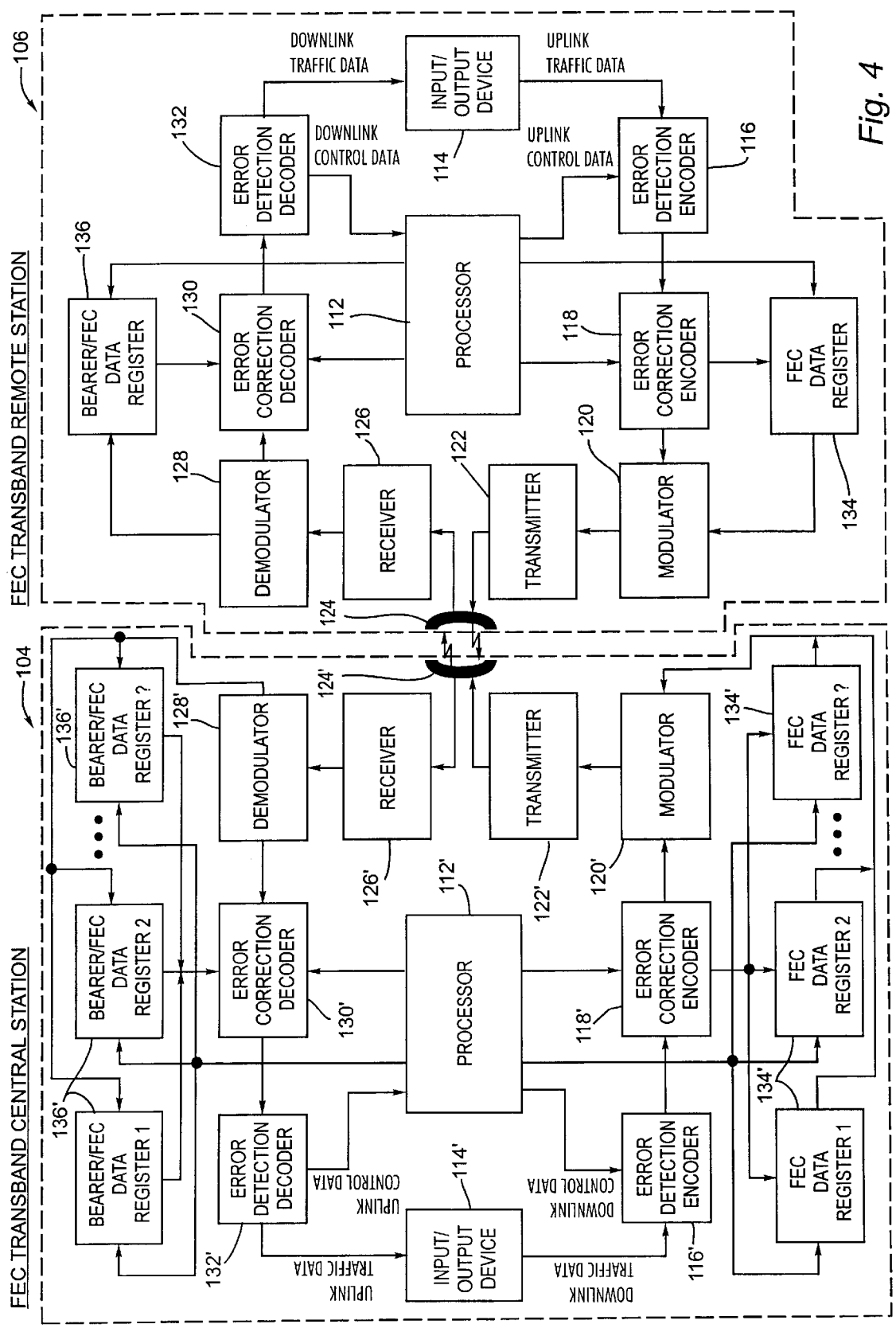
FIG. 4 is a representative block diagram of the FEC transband central station and one of the FEC transband remote stations.

FIG. 4 depicts a block diagram of the FEC transband central station 104 and one of the FEC transband remote stations 106 of the wireless communications system 100 in communication with each other (TDMA/FDD or TDMA/TDD). The FEC transband central station 104 and the FEC transband remote station 106 utilize a reciprocal out-of-band FEC scheme to ensure proper and efficient communication between the FEC transband central station 104 and the FEC transband remote station 106.

The FEC transband remote station 106 transmits uplink bearer data packets and uplink error correction packets to the FEC transband central station 104 in accordance with the TDMA/FDD or TDMA/TDD scheme as respectively depicted in FIGS. 2 and 3. The FEC transband remote station 106 employs a processor 112 to orchestrate the timing of the uplink bearer data packet and uplink error correction data packet transmissions.

The uplink error correctable bearer data packets comprise uplink traffic data originating from an input/output device 114 electrically coupled to the FEC transband remote station 106. The input/output device 114 is typically a voice encoder/decoder or a data unit, such as, e.g., a personal computer. The processor 112 is electrically coupled to and performs handshaking operations with the input/output device 114 during which uplink traffic data is transferred from the input/output device 114. The input/output device 114 is electrically coupled and transfers uplink bearer data packets to an error detection encoder 116.

The processor 112 is also electrically coupled and transfers uplink control data, such as status data informing the FEC transband central station 104, to the error detection encoder 116. The error detection decoder 116 appends the uplink bearer data packet with the uplink control data. The error detection decoder 116 also generates error detection data according to a cyclical redundancy check (CRC) algorithm and appends the uplink bearer data packet with the error detection data. The error detection encoder 116 can, however, employ other types of error detection algorithms without straying from the principles taught by this invention.

The error detection decoder 116 is electrically coupled to an error correction encoder 118. The error correction encoder 118 generates error correction data according to an error correction algorithm. The error correction encoder 118 is electrically coupled to an FEC data register 134, which stores error correction data separately from the uplink bearer data packets.

The error correction encoder 118 is electrically coupled to a modulator 120, which modulates the uplink bearer data packets onto a carrier frequency each in appropriate time slots. The FEC data register 134 is also electrically coupled to the modulator 120, which modulates uplink error correction data packets onto a carrier frequency each in appropriate time slots. The modulator 120 is electrically coupled to transmitter 122, which amplifies and filters the uplink bearer data packets and error correction packets. The transmitter is electrically coupled to an antenna 124, which transmits the uplink bearer data packets and uplink error correction data packets over-the-air to the FEC transband central station 104.

The FEC transband remote station 106 also receives downlink bearer data packets and downlink error correction data packets from the FEC transband central station 104 in accordance with the TDMA/FDD or TDMA/TDD scheme respectively depicted in FIGS. 2 and 3. As with the uplink bearer data packet and uplink error correction data packet transmissions, the FEC transband remote station processor 112 orchestrates the timing of the downlink bearer data packet and downlink error correction data packet reception. The downlink bearer data packets comprise downlink traffic data originating from an input/output device 114' electrically coupled to the FEC transband central station 104. The input/output device 114' on the FEC transband central station 104 side of the wireless communications system 100 is typically an interface to a communications network, such as the Public Switched Telephone Network (PSTN) or the internet.

The antenna 124 receives downlink bearer data packets and downlink error correction data packets over-the-air from the FEC transband central station 104. The antenna 124 is electrically coupled to the receiver 126, which filters the downlink bearer data packets and downlink error correction data packets. The receiver 126 is electrically coupled to a demodulator 128, which extracts the downlink bearer data packets and downlink error correction data packets from the carrier frequency.

The demodulator 128 is electrically coupled to an error correction decoder 130, which processes the downlink bearer data packets and downlink error correction data packets, and corrects the downlink bearer data packets according to an error correction algorithm.

The FEC transband remote station 106 includes a bearer/FEC data register 136, which is electrically coupled between the demodulator 128 and the error correction decoder 130. The bearer/FEC data register 136 stores and accumulates downlink bearer data packets and downlink error correction data packets prior to the processing thereof through the error correction decoder 130.

Figure 5:
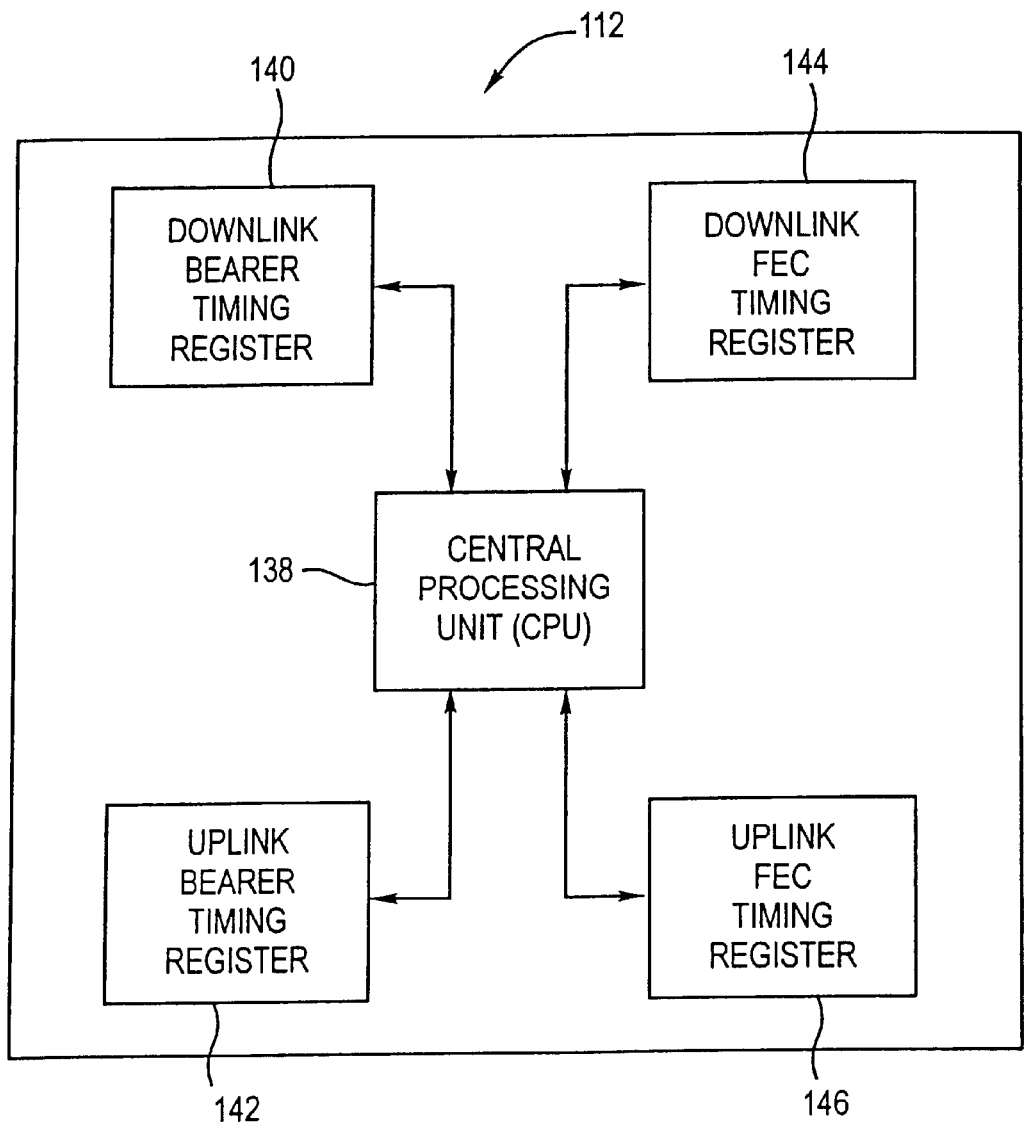
FIG. 5 is a representative block diagram of an FEC transband remote station processor.

As shown in FIG. 5, the FEC transband remote station processor 112 comprises a CPU 138, which performs all of the processing functions in the FEC transband remote station 106. The processor 112 further comprises instructions that allow the FEC transband remote station 106 to transmit uplink bearer data packets during uplink in-band time slots 109 and corresponding uplink error correction data packets during uplink out-of-band time slots 111, and receive downlink bearer data packets during downlink in-band time slots 109 and corresponding downlink error correction data packets during downlink out-of-band time slots 111. These instructions take the form of a computer software program embedded in a storage device, such as, e.g., a ROM chip, which can be either on-board or separate from the CPU 138.

The FEC transband remote station processor 112 further comprises various memory locations for the storage of status data concerning the FEC scheme employed by the wireless communications system 100. For the purposes of illustration, these memory locations are depicted in FIG. 5 as registers. It should be understood, however, that any memory storage vehicle that allows for the storage and access of data can be employed.

The processor 112 comprises a downlink bearer timing register 140, uplink bearer timing register 142, downlink FEC timing register 144, and uplink FEC timing register 146. The downlink bearer timing register 140 stores synchronization data indicating the particular in-band time slot 109 and particular time frame 108 during which the FEC transband remote station 106 receives a downlink bearer data packet from the FEC transband central station 104. The uplink bearer timing register 142 stores synchronization data indicating the particular in-band time slot 109 and particular time frame 108 during which the FEC transband remote station 106 transmits an uplink bearer data packet to the FEC transband central station 104. Typically, the FEC transband remote station 106 respectively transmits a bearer data packet to the FEC transband central station 104 and receives a bearer data packet from the FEC transband central station 104 during every time frame 106.

The downlink FEC timing register 144 stores synchronization data indicating the designated out-of-band time slot 111 and the designated time frame 108 during which the FEC transband remote station 106 receives a downlink error correction data packet from the FEC transband central station 104. The uplink FEC timing register 146 stores synchronization data indicating the designated out-of-band time slot 111 and the designated time frame 108 during which the FEC transband remote station 106 transmits an uplink error correction data packet to the FEC transband central station 104. The synchronization data residing in each of the above-mentioned timing registers are characterized into two types, current and future. The current synchronization data relates to the current time frame pairs 108(1)/(2), and the future synchronization data relates to the immediately next time frame pairs 108(1)/(2).

The componentry of the FEC transband central station 104 is similar to the componentry of the FEC transband remote station 106. That is, as shown in FIG. 4, the FEC transband central station 104, like the FEC transband remote station 106, comprises a processor 112', error detection encoder 116', error correction encoder 118', modulator 120', transmitter 122', and antenna 124', which are all configured and arranged with each other and with an input/output device 114' to facilitate the transmission of downlink bearer data packets to a multitude of FEC transband remote stations 106. Likewise, the FEC transband central station 104 further comprises a receiver 126', demodulator 128', error correction decoder 130', and error detection decoder 132', which are all configured and arranged with each other and with the processor 112', antenna 124', and input/output device 114' to facilitate the reception of uplink bearer data packets from a multitude of FEC transband remote stations 106.

The FEC transband central station 104 further includes a set of FEC data registers 134' and a set of bearer/FEC data registers 136', which are respectively similar to, and function in much the same manner, as the FEC data register 134 and bearer/FEC data register 136 employed in the FEC transband remote station 106. The number of registers in the respective sets of FEC data registers 134' and bearer/FEC data registers 136 equals the number of FEC transband remote stations 106 for which the time frame pairs 108(1)/(2) (TDMA/FDD) supports or time frame 108(3) (TDMA/TDD) supports. The set of FEC data registers 134' is arranged with the processor 112', error correction encoder 118', and modulator 120' in much the same manner as described above with respect to the FEC transband remote station 106. Likewise, the set of bearer/FEC data registers 136' is arranged with the processor 112', error correction decoder 130', and demodulator 128' in much the same manner as described above with respect to the FEC transband remote station 106.

Figure 6:
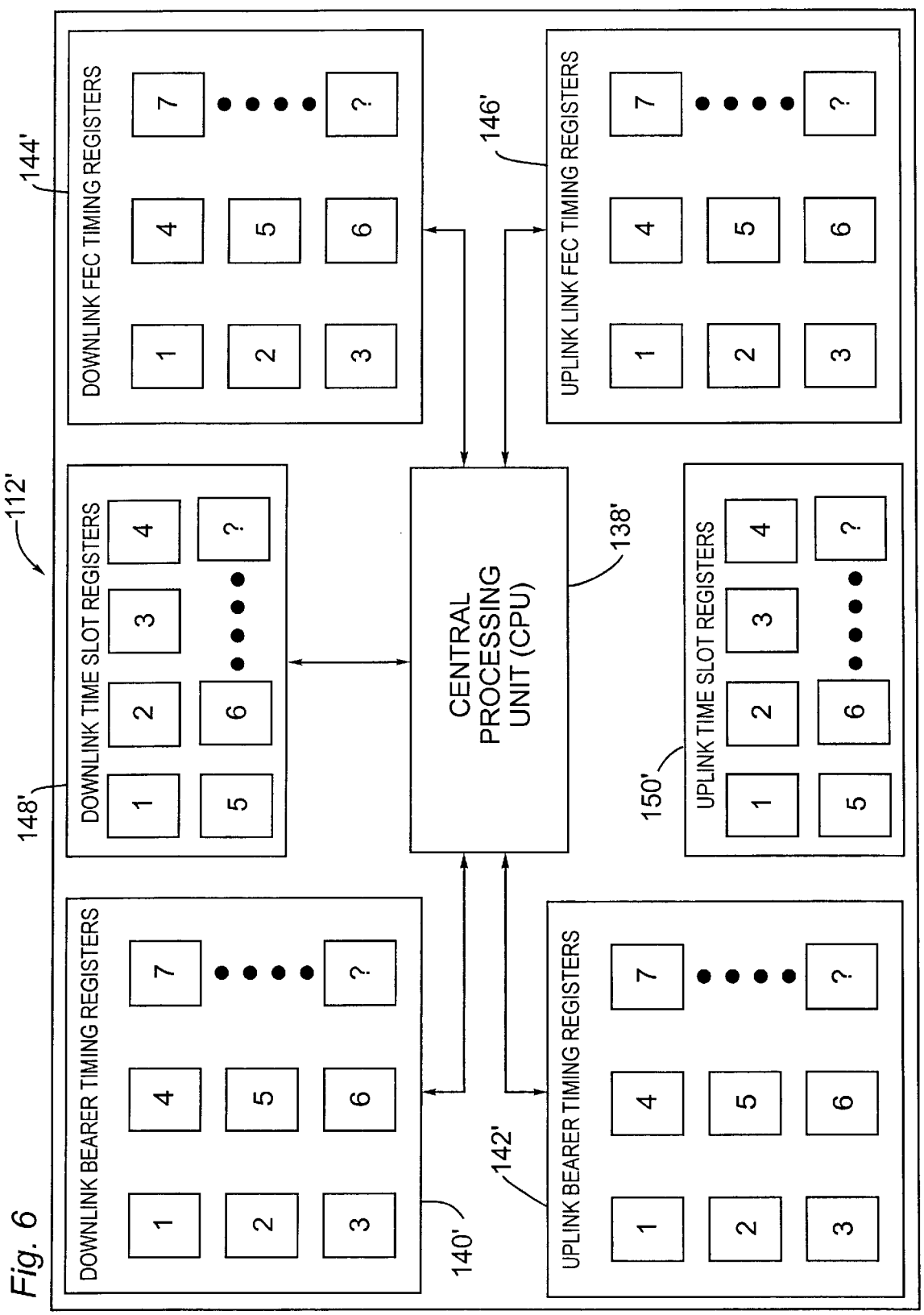
FIG. 6 is a representative block diagram of an FEC transband central station processor.

As shown in FIG. 6, the FEC transband central station processor 112' comprises a CPU 138' which performs all of the processing functions in the FEC transband central station 104. The processor 112' further comprises instructions that allow the FEC transband remote station 106 to transmit downlink bearer data packets during downlink in-band time slots 109 and corresponding downlink error correction data packets during downlink out-of-band time slots 111, and receive uplink bearer data packets during uplink in-band time slots 109 and corresponding uplink error correction data packets during uplink out-of-band time slots 111. These instructions also allow the FEC transband central station 104 to dynamically adjust a remote station assignment combination is response to an alteration of a system data overhead, as will be described in further detail below. These instructions take the form of a computer software program embedded in a ROM chip, which can be either on-board or separate from the CPU 138'.

The FEC transband central station processor 112' further comprises various memory locations for the storage of status data concerning the FEC scheme employed by the wireless communications system 100. For the purposes of illustration, these memory locations are depicted in FIG. 6 as registers. It should be understood, however, that any memory storage vehicle that allows for the storage and access of data can be employed.

The processor 112' comprises sets of downlink bearer timing registers 140' uplink bearer timing registers 142', downlink FEC timing registers 144', and uplink FEC timing registers 146', which are respectively similar to and function in much the same manner as the downlink bearer timing register 140, uplink bearer timing register 142, downlink FEC timing register 144, and uplink FEC timing register 146 employed by the FEC transband remote station processor 112. The number of registers in each set of downlink bearer timing registers 140', uplink bearer timing registers 142', downlink FEC timing registers 144', and uplink FEC timing registers 146' equals the number of FEC transband remote stations 106, which the time frame pairs 108(1)/(2) (TDMA/FDD) support, or the time frames 108(3) (TDMA/TDD) supports.

The FEC transband central station 104 controls the nature of each time slot 110 (i.e., whether it is unused, used as an in-band time slot 109, or used as an out-of-band time slot 111), and the particular FEC transband remote station 106 or FEC transband remote stations 106 that use each time slot 110. To facilitate this function, the processor 112' comprises a set of downlink time slot registers 148' and a set of uplink time slot registers 150'. The number of registers in the set of downlink time slot registers 148' equals the number of downlink time slots 110 available to the FEC transband remote stations 106, and the number of registers in the set of uplink time slot registers 150' equals the number of uplink time slots 110 available to the FEC transband remote stations 106. Each register, in the set of downlink time slot registers 148' and set of uplink time slot registers 150', stores data indicating the current time slot type (unused, in-band, out-of-band), the identification of the FEC transband remote station(s) 106 using each time slot 110 (if a particular out-of-band time slot 111 includes sub-out-of-band time slots 111', there may be more than one FEC transband remote station 106 identified), and the error correction data overhead currently supported by the out-of-band time slot 111 if the time slot 110 is an out-of-band time slot 111.

It should be noted, for purposes of simplicity in describing the principles of this invention, only the componentry in the FEC transband central station 104 necessary to communicate with a multitude of FEC transband remote stations 106 over a single pair of downlink and uplink frequencies (TDMA/FDD) or a single downlink/uplink frequency (TDMA/TDD) is depicted in FIGS. 4 and 6. In reality, however, the FEC transband central station 104 communicates with a multitude of FEC transband remote stations 106 over a range of downlink and uplink frequency pairs (TDMA/FDD) or downlink/uplink frequencies (TDMA/TDD) and includes other components not employed in the FEC transband remote station 106, such as a multiplexer and demultiplexer. Furthermore, the number of respective sets of FEC data registers 134', bearer/FEC data registers 136', downlink bearer timing registers 140', uplink bearer timing registers 142', downlink FEC timing registers 144', uplink FEC timing registers 146', downlink time slot registers 148', and uplink time slot registers 150' is equal to number of downlink and uplink frequency pairs (TDMA/FDD) or number of downlink/uplink frequencies (TDMA/TDD) that are employed by the wireless communications system 100.

Referring to FIGS. 2 and 4, the operation of the wireless communications system 100 configured in a TDMA/FDD format is described with respect to the transmission of bearer data packets and error correction data packets between the FEC transband central station 104 and a particular FEC transband remote station 106 during downlink time frames 108(1) and uplink time frames 108(2).

The FEC transband central station 104 transmits a bearer data packet to the FEC transband remote station 106 during a designated in-band time slot 109(1) of the downlink time frame 108(1). The FEC transband remote station 106 receives and stores the bearer data packet. The FEC transband central station 104 stores the error correction data, if any, corresponding to the bearer data packet. If the FEC transband central station 104 does not transmit error correction data packets to the FEC transband remote station 106 during a sub-out-of-band time slot 111(1)', the FEC transband central station 104 transmits the error correction data as an error correction data packet to the FEC transband remote station 106 during a designated downlink out-of-band time slot 111(1) of the same downlink time frame 108(1) during which the corresponding bearer data packet is transmitted. The FEC transband remote station 106 receives the error correction data packet and corrects the bearer data packet.

For instance, if the FEC transband remote station 106 is FEC transband remote station 4, as depicted in FIG. 2, the FEC transband central station 104 transmits one bearer data packet to FEC transband remote station 4 during a downlink time frame 108(1) while storing error correction data corresponding to the bearer data packet. FEC transband remote station 4 receives and stores the bearer data packet during time slot D7 of the downlink time frame 108(1). The FEC transband central station 104 transmits the error correction data packet to FEC transband remote station 4 during the same downlink time frame 108(1) as that during which the bearer data packet is transmitted. FEC transband remote station 4 receives the error correction data packet during time slot D12 and corrects the bearer data packet.

If the FEC transband central station 104 transmits error correction data packets during a downlink sub-out-of-band time slot 111(1)', however, the FEC transband central station 104 stores and accumulates error correction data corresponding to a multitude of bearer data packets respectively transmitted during a multitude of downlink time frames 108(1). The FEC transband remote station 106 receives, stores, and accumulates the multitude of bearer data packets until it receives the corresponding error correction data packet. The FEC transband central station 104 transmits the accumulated error correction data as an error correction data packet to the FEC transband remote station 106 during the designated downlink out-of-band time slot 111(1) of the designated time frame 108(1). The FEC transband remote station receives the error correction data packet and corrects the multitude of accumulated bearer data packets.

For instance, if the FEC transband remote station 106 is FEC transband remote station 2, as depicted in FIG. 2, and FEC transband remote stations 1–3 respectively have a 33⅓% overhead rating, the FEC transband central station 104 respectively transmits three bearer data packets to FEC transband remote station 2 during three downlink time frames 108(1) while accumulating error correction data corresponding to the three bearer data packets. FEC transband remote station 2 receives and accumulates the three bearer data packets during time slot D2 of the three downlink time frames 108(1). The FEC transband central station 104 transmits the error correction data packet to FEC transband remote station 2 during the same downlink time frame 108(1) as that during which the 3rd bearer data packet is transmitted. FEC transband remote station 2 receives the error correction data packet during time slot D10 and corrects the three accumulated bearer data packets.

In accordance with the above-described general procedure, the communication process between the FEC transband central station 104 and the particular FEC transband remote station 106 is described using block coding. The FEC transband central station processor 112' first updates the register that comprises the identification data pertaining to the FEC transband remote station 106 in each of the sets of downlink bearer timing registers 140', uplink bearer timing registers 142', downlink FEC timing registers 144', and uplink FEC timing registers 146' with future synchronization data (i.e., synchronization data concerning the next time frame pairs 108(1)/(2)).

The FEC transband central station processor 112' then obtains current synchronization data (i.e., synchronization data concerning the current downlink time frame 108(1) and uplink time frame 108(2)) from the register pertaining to the FEC transband remote station 106 in each of the sets of downlink bearer timing registers 140', uplink bearer timing registers 142', downlink FEC timing registers 144', and uplink FEC timing registers 144'. Likewise, the FEC transband remote station processor 112 obtains current synchronization data from the downlink bearer timing register 140, uplink bearer timing register 142, downlink FEC timing register 144, and uplink FEC timing register 146.

In accordance with the current synchronization data, the FEC transband central station processor 112' directs the FEC transband central station 104 to transmit a downlink bearer data packet during the designated in-band time slot 109(1) of the current downlink time frame 108(1). The processor 112' accesses the pertinent register in each of the sets of downlink bearer timing registers 140', uplink bearer timing registers 142', downlink FEC timing registers 144', and uplink FEC timing registers 146', and obtains the future synchronization data therefrom.

If an Automatic Retry Request (ARQ) signal was not received from the FEC transband remote station 106, as will be described in further detail below, the FEC transband central station processor 112' sends a control signal to the input/output device 114' directing transferal of traffic data to the error detection encoder 116' as a downlink bearer data packet.

The processor 112' transfers downlink control data to the error detection encoder 116' indicating the future synchronization data. The error detection encoder 116' appends the downlink bearer data packet with the downlink control data. The error detection encoder 116' also generates error detection data based on the downlink bearer data packet according to an error detection algorithm and appends the downlink bearer data packet therewith. The error detection encoder 116' then transfers the downlink bearer data packet to the error correction encoder 118'. The error correction encoder 118' generates error correction data based on the downlink bearer data packet according to the error correction algorithm. The error correction encoder 118' transfers the error correction data to the pertinent register of the set of FEC data registers 134', where it is stored and accumulated or transmission as a downlink error correction data packet during the designated downlink out-of-band time slot 111(1) of the designated downlink time frame 108(1). It should be noted that the designated downlink time frame 108(1) may not be the current downlink time frame 108(1) if the error correction data packet is transmitted in a downlink sub-out-of-band time slot 111(1)'.

The error correction encoder 118' transfers the downlink bearer data packet to the modulator 120', where it is modulated onto a downlink carrier frequency. The downlink bearer data packet is then transferred to the transmitter 122', where it is amplified and filtered. The transmitter 122' then transfers the downlink bearer data packet to the antenna 124', where it is transmitted over-the-air to the antenna 124 of the FEC transband remote station 106.

If an ARQ signal, however, was received, the FEC transband central station processor 112' directs the input/output device 114' (or internal storage) to re-transfer to the error detection encoder 116' the same traffic data that was included in the defective bearer data packet. The downlink bearer data packet is then processed through the FEC transband central station 104 in the same manner as if no ARQ signal was received.

To preserve a First In First Out (FIFO) protocol, any downlink bearer data packets that had been transmitted by the FEC transband central station 104 during the previous downlink time frames 108(1), but after the transmission of the defective bearer data packet, are re-transmitted during future downlink time frames 108(1) subsequent to the re-transmission of the bearer data packet corresponding to the defective bearer packet. The error correction data packet, which is transmitted during the current downlink time frame 108(1) or during a future downlink time frame 108(1), includes at its beginning the same error correction data as that associated with the defective bearer data packet. As described in further detail below, the bearer data packets received prior to the receipt of the defective bearer data packet and the portion of the error correction data packet pertaining to these prior bearer data packets have already been processed, and thus need not be re-transmitted.

In accordance with the current synchronization data, the FEC transband remote station processor 112 directs the FEC transband remote station 106 to receive the downlink bearer data packet during the designated in-band time slot 109(1) of the current downlink time frame 108(1). The antenna 124, of the FEC transband remote station 106, receives the downlink bearer data packet. The downlink bearer data packet is transferred to the receiver 126, where it is filtered and transferred to the demodulator 128. The demodulator 128 demodulates the downlink bearer data packet from the carrier frequency, and transfers the downlink bearer data packet to the bearer/FEC data register 136, where it is stored until the FEC transband remote station 106 receives a downlink error correction data packet.

In accordance with the current synchronization data, the FEC transband central station processor 112' directs the FEC transband central station 104 to transmit a downlink error correction data packet during the designated downlink out-of-band time slot 111(1) of the designated downlink time frame 108(1).

If the current synchronization data indicates that a downlink error correction data packet should not be transmitted to the FEC transband remote station 106 during the current downlink time frame 108(1), the FEC transband central station processor 112' directs the FEC transband central station 104 not to transmit a downlink error correction data packet during the current downlink time frame 108(1). Instead, the error correction data stored in the pertinent register of the set of FEC data registers 132' is transmitted to the FEC transband remote station 106 during a future downlink time frame 108(1) as a downlink error correction data packet.

If the current synchronization data indicates that a downlink error correction data packet should be transmitted during the current downlink time frame 108(1), the FEC transband central station processor 112' directs the FEC transband central station 104 to transmit a downlink bearer data packet during the designated downlink out-of-band time slot 111(1) of the current downlink time frame 108(1).

The FEC transband central station processor 112' sends a control signal to the pertinent register of the set of FEC data registers 134' prompting it to transfer the error correction data to the modulator 120' as a downlink error correction data packet, where it is modulated onto an uplink carrier frequency. The downlink error correction data packet is then transferred to the transmitter 122', where it is amplified and filtered. The transmitter 122' then transfers the downlink error correction data packet to the antenna 124', where it is transmitted over-the-air to the antenna 124 of the FEC transband remote station 106 during the designated downlink out-of-band time slot 111(1) of the current downlink time frame 108(1).

In accordance with the current synchronization data, the FEC transband remote station processor 112 directs the FEC transband remote station 106 to receive the downlink error correction data packet during the designated downlink out-of-band time slot 111(1) of the designated downlink time frame 108(1), which may not be the current downlink time frame 108(1) if the error correction data packet is transmitted in a downlink sub-out-of-band time slot 111(1)'.

If the current synchronization data indicates that a downlink error correction data packet should not be received by the FEC transband remote station 106 during the current downlink time frame 108(1), the FEC transband remote station processor 112 directs the FEC transband remote station 106 not to receive an error correction data packet and correct any of the received downlink bearer data packets. Instead, any bearer data packets stored in the bearer/FEC data register 136 are corrected during a future downlink time frame 108(1).

If the current synchronization data indicates that a downlink error correction data packet should be received by the FEC transband remote station 106 during the current downlink time frame 108(1), the FEC transband remote station processor 112 directs the FEC transband remote station 106 to receive the error correction data packet and correct the received downlink bearer data packets. The antenna 124 of the FEC transband remote station 106 receives the downlink error correction data packet. The downlink error correction data packet is transferred to the receiver 126, where it is filtered and transferred to the demodulator 128. The demodulator 128 extracts the downlink error correction data packet from the carrier frequency, and transfers the downlink error correction data packet to the bearer/FEC data register 136.

The FEC transband remote station processor 112 sends a control signal to the bearer data/FEC register 134 transferring the downlink bearer data packet first input into the bearer data/FEC register 134 and a portion of the downlink error correction data packet associated with the first downlink bearer data packet to the error correction decoder 130. It should be noted that if a sub-out-of-band time slot 111(1)' is not utilized, the first downlink bearer data packet will be the only downlink bearer data packet in the bearer data/FEC register 134, and the entire downlink error correction data packet will correspond to this downlink bearer data packet. If a sub-out-of-band time slot 111(1)' is utilized, however, the first downlink bearer data packet will be the first of several downlink bearer data packets in the bearer data/FEC register 134, and only a portion of the downlink error correction data packet will correspond to this downlink bearer data packet. The error correction decoder 130 then corrects the downlink bearer data packet within the limits of the error correction algorithm that was used by the FEC transband central station 104 to generate the error correction data. The corrected downlink bearer data packet is then transferred to the error detection decoder 132, where it is processed to determine the existence of any residual errors.

If the error detection decoder 132 does not sense a residual error in the corrected downlink bearer data packet, the error detection decoder 132 sends a control signal to the processor 112 indicating that the error detection decoder 132 currently possesses a valid downlink bearer data packet. The downlink control data is then separated from the downlink bearer data packet. The downlink bearer data packet is transferred to the input/output device 114 where it is processed as a valid downlink bearer data packet, and the downlink control data is transferred to the processor 112 where it is accordingly processed.

If the error detection decoder 132 senses at least one residual error in the first corrected downlink bearer data packet, thus detecting a defective downlink bearer data packet, the error detection decoder 132 sends a control signal to the processor 112 indicating the existence of a defective downlink bearer data packet. If the input/output device is not delay-sensitive (e.g., a data unit), the defective downlink bearer data packet is not transferred to the input/output device 114. Instead, the processor 112 directs the FEC transband remote station 106 to transmit ARQ uplink control data to the FEC transband central station 104 during the in-band time slot of the next available uplink time frame 108(2). The uplink control data also indicates the particular defective bearer data packet. Because the defective bearer data packet and any subsequent data packets that were previously transmitted will be re-transmitted, the processor 112 sends a control signal to the error correction decoder 130 and bearer/FEC data register 136 purging any downlink bearer data and downlink error correction data therein. Any remaining downlink error correction data associated with the purged bearer data packets and received during a future downlink time frame 108(1) is also purged.

In alternative embodiments, the remaining downlink bearer data and corresponding downlink error correction data are not purged, and only the defective downlink bearer data packet is re-transmitted again. That is, the downlink bearer data packets and the downlink error correction data corresponding to these bearer data packets received by the FEC transband remote station 106 subsequent to the receipt of the defective bearer data packet are not re-transmitted again. When the FEC transband remote station 106 receives the re-transmitted downlink bearer data packet and the downlink error correction data corresponding to the downlink bearer data packet, the re-transmitted downlink bearer data packet is corrected first, and the remaining downlink bearer data packets are corrected in the same manner as if there was never a defective downlink bearer data packet.

If the input/output device 114 is delay-sensitive (e.g., a voice encoder/decoder), the defective downlink bearer data packet is outputted to the input/output device 114 as defective uplink traffic data. The processor 112, however, sends a control signal to the input/output device 114 indicating defective downlink traffic data.

If a residual error is not detected in the corrected bearer data packet, or if the input/output device 114 is delay-sensitive, the processor 112 then sends a control signal to the bearer/FEC data register 136 to transfer the next downlink bearer data packet, if applicable, and a portion of the error correction data packet associated with the next downlink bearer data packet to the error correction decoder 130. The error correction decoder 130 corrects the next downlink bearer data packet within the limits of the error correction algorithm. The corrected downlink bearer data packet is then processed in the same manner as the first downlink bearer data packet discussed above.

This downlink bearer data packet correction and detection process is repeated until all of the downlink bearer data packets currently stored in the bearer/FEC data register 136 have been processed through the FEC transband remote station 106. It should also be noted that in some instances, the error correction data included in a received downlink error correction packet does not correspond to an exact number of received downlink bearer data packets. The amount of received error correction data may be more or less than the required amount to correct all of the stored and accumulated downlink bearer data packets.

In an alternative method of encoding bearer data packets when employing a sub-out-of-band slot 111(1)', rather than generating a divisible error correction data packet, (i.e., an error correction data packet, the portions of which respectively correspond to a plurality of bearer data packets), an error correction data packet corresponding to a plurality of bearer data packets as a whole is generated. That is, several time slots worth of bearer data is transferred to the error correction encoder 118' of the FEC transband central station 104, wherein error correction data corresponding to the bearer data as a whole is generated. The bearer data is transmitted to the FEC transband remote station 106 as a plurality of bearer data packets, where it is received and accumulated over a plurality of downlink time frames 108(1). The error correction data is transmitted to the FEC transband remote station 106 as an error correction data packet, where it is used to correct the plurality of bearer data packets as a whole. If a residual error is detected, the FEC transband remote station 106 sends an ARQ control signal to the FEC transband central station 104 indicating that the plurality of bearer data packets and the error correction data packet should be re-transmitted.

The FEC transband central station processor 112' lastly carries the future synchronization data stored in the pertinent register of the sets of downlink bearer timing registers 140', uplink bearer timing registers 142', downlink FEC timing registers 144', and uplink FEC timing registers 146' over to the current synchronization data to be used during the next time frame pair 108(1)/(2) as described in further detail below.

In accordance with the current synchronization data, the FEC transband remote station processor 112 directs the FEC transband remote station 106 to generate and transmit uplink bearer data packets and uplink error correction data packets, and the FEC transband central station processor 112' directs the FEC transband central station 104 to receive and correct the uplink bearer data packets and uplink error correction data packets in the same manner as described above with respect to the downlink bearer data packets and downlink error correction data packets. Any control signal that the FEC transband remote station 106 encodes onto an uplink bearer data packet, however, does not include any synchronization data, since control of the synchronization data is centralized at the FEC transband central station 104.

The operation of the wireless communications system 100 configured in a TDMA/TDD format is similar to that described above, with respect to the wireless communications system 100 configured in the TDMA/FDD format, with the difference being that the FEC transband remote station 106 receives downlink bearer data packets and downlink error correction data packets, and transmits uplink bearer data packets and uplink error correction data packets during a single downlink/uplink time frame 108(3), rather than a downlink time frame 108(1) and an uplink time frame 108(2).

It should be noted that the order in which the FEC transband remote station 106 either transmits or receives the downlink bearer data packets, uplink bearer data packets, downlink error correction blocks, and uplink error correction data packets is not limited to the order described above, and may be transmitted in any order without straying from the principles taught by this invention.

Figure 7:
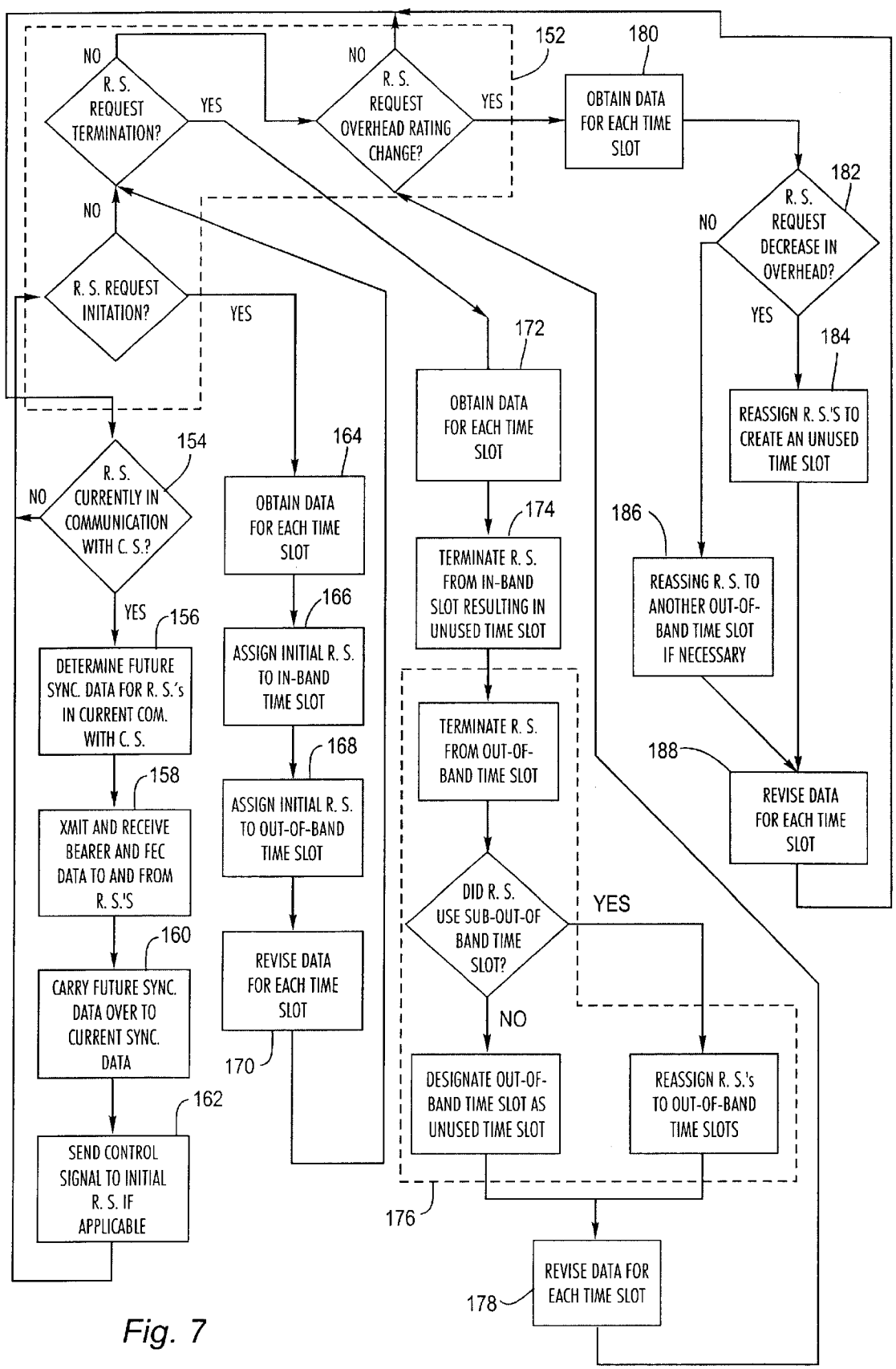
FIG. 7 is a flow diagram illustrating a protocol for transmitting and receiving bearer data and error correction data between the FEC transband central station and the plurality of FEC transband remote stations and dynamically adjusting a remote station assignment combination.

Referring to FIGS. 2 and 7, the operation of the wireless communications system 100 configured in a TDMA/FDD format is described at a system level with respect to the transmission of bearer data packets and error correction data packets over a downlink and uplink frequency pair between the FEC transband central station 104 and a multitude of FEC transband remote stations 106 during a current downlink time frame 108(1) and uplink time frame 108(2).

The wireless communications system 100 includes a system error correction data overhead (i.e., the total error correction data overhead required of the FEC transband remote stations 106 in current communication with the FEC transband central station) and a system traffic data overhead (i.e., the total traffic data overhead required of the FEC transband remote stations 106 in current communication with the FEC transband central stations, which for purposes of this specification, will be referred collectively as the system data overhead. The wireless communication system 100 also includes a current remote station assignment combination (e.g., as shown in FIG. 2, FEC transband remote stations 1–3 are respectively assigned to time slots D1, D2 and D5 as downlink in-band time slots 109(1) and time slot D10 as a downlink out-of-band time slot 111(1), and FEC transband remote station 4 is assigned to time slot D7 as a downlink in-band time slot 109(1) and time slot 12 as an out-of-band time slot 111(1)). The current remote station assignment combination does not change as long as the system data overhead remains unchanged. There are certain instances, however, where the system data overhead must be altered, such as if an FEC transband remote station seeks to initiate communication with the FEC transband central station (hereinafter referred to as "an initiating FEC transband remote station"), an FEC transband remote station seeks to terminate communication with the FEC transband central station (hereinafter, referred to as "a terminating FEC transband remote station"), or an FEC transband remote station seeks to alter its error correction overhead rating (hereinafter, referred to as "an overhead altering FEC transband remote station"). In this case, the current remote station assignment combination is changed by selecting a future remote station assignment combination to accommodate the change in the system data overhead.

At step 152, the FEC transband central station 104 determines, during the beginning of the current downlink time frame 108(1) and uplink time frame 108(2) (time frame pair 108(1)/(2)), whether the system data overhead of the wireless communication system 100 should be changed in the next time frame pair 108(1)/(2). The FEC transband central station processor 112' first determines whether an FEC transband remote station 106 seeks to initiate communication with the FEC transband central station 104. An FEC transband remote station 106 requests initiation of communication with the FEC transband central station 104 by transmitting a request signal over a dedicated broadcast channel, which is then received and processed by the FEC transband central station 104 during a dedicated broadcast time slot (not depicted) of the uplink time frame 108(2).

The FEC transband central station processor 112' secondly determines whether an FEC transband remote station 106, in current communication with the FEC transband central station 104, seeks to terminate communication with the FEC transband central station 104. An FEC transband remote station 106 requests termination of communication with the FEC transband central station 104 by transmitting a bearer data packet with control data indicating a request to terminate communication with the FEC transband central station 104 during an in-band time slot 109(2) of an uplink time frame 108(2), which is then received and processed by the FEC transband central station 104.

The FEC transband central station processor 112' thirdly determines whether an FEC transband remote station 106, currently in communication with the FEC transband central station 104, seeks to adjust its overhead rating with respect to downlink transmissions, or whether the FEC transband central station 104 seeks to adjust the overhead rating of the FEC transband remote station 106 with respect to uplink transmissions. An FEC transband remote station 106 requests adjustment of its overhead rating by transmitting a bearer data packet with control data indicating a selection of an error correction algorithm during an in-band time slot 109(2) of an uplink time frame 108(2), which is then received and processed by the FEC transband central station 104. The FEC transband central station 104 requests adjustment of the overhead rating of the FEC transband remote station 106 by transmitting control data indicating a selection of an error correction algorithm during an in-band time slot 109(1) of a downlink time frame 108(1).

If the FEC transband central station 104 does not receive a signal from an FEC transband remote station 106 indicating a request to initialize communication with the FEC transband central station 104, terminate communication with the FEC transband central station, or if there is no request by either the FEC transband remote station 106 or the FEC transband central station 104 to adjust the overhead rating of the FEC transband remote station 106, the FEC transband central station determines that the system data overhead should not be changed. The wireless communications system 100 then goes to steps 154 through 160, where the FEC transband central station 104 communicates with the FEC transband remote stations 106 that are in current communication with the FEC transband central station 104.

At step 154, the FEC transband central station 104 determines whether there are any FEC transband remote stations 106 in current communication with the FEC transband central station. If no FEC transband remote station 106 is in current communication with the FEC transband central station 104, the wireless communications system 100 returns to step 152, where the FEC transband central station 104 again determines, during the next time frame pair 108(1)/(2), whether the system data overhead should be changed.

If at step 154, any FEC transband remote stations 106 are currently in communication with the FEC transband central station 104, the FEC transband central station 104 determines the future synchronization data at step 156. That is, the FEC transband central station processor 112' determines for each FEC transband remote station 106, the next in-band time slot pair 109(1)/(2) and next time frame pair 108(1)/(2) during which a bearer data packet is respectively transmitted and received. The FEC transband central station 112' also determines, for each FEC transband remote station 106, the next out-of-band time slots 111(1) and out-of-band time slots 111(2) (out-of-band time slot pairs 111(1)/(2)) and next time frame pair 108(1)/(2) during which each of the FEC transband remote stations 106 respectively receive and transmit an error correction data packet. The FEC transband central station processor 112' then accordingly updates the future synchronization data in the future sets of downlink bearer timing registers 140', uplink bearer timing registers 142', downlink error correction timing registers 144', and uplink error correction timing registers 146' with this information.

As long as no FEC transband remote stations 106 are reassigned (due to initiation, termination, or change of overhead of a remote station), the particular in-band time slot pairs 109(1)/(2) and out-of-band time slot pairs 111(1)/(2) respectively used by the FEC transband remote station 106 remains constant. In this case, the synchronization data with respect to in-band time slot pairs 109(1)/(2) and out-of-band time slot pairs 111(1)/(2) remains the same from time frame to time frame.

If any of the FEC transband remote stations 106 employ sub-out-of-band time slot pairs 111(1)/(2)', each of these FEC transband remote stations 106 will not use every time frame pair 108(1)/(2), but rather shares each time frame pair 108(1)/(2). In this case, the synchronization data with respect to time frame pairs 108(1)/(2) changes. With respect to a plurality of remote stations 106 that share a particular out-of-band time slot pair 111(1)/(2), the FEC transband central station processor 112' selects an FEC transband remote stations 106 to respectively transmit and receive an error correction data packet during the next time frame pair 108(1)/(2) by taking into account the following criteria.

With respect to a particular downlink sub-out-of-band time slot 111(1)', the particular FEC transband remote station 106 selected is that for which the FEC transband central station 104 will have currently stored the greatest amount of error correction data immediately prior to the reception of an error correction data packet during the next downlink time frame 108(1). If there are two or more FEC transband remote stations 106 for which the FEC transband central station 104 will have stored the greatest amount of error correction data, the FEC transband remote station 106 that has the least overhead rating (i.e., the FEC transband remote station 106 that incurs the greatest time delay over a given amount of downlink time frames 108(1)) is selected. If there are two or more FEC transband remote stations 106 that have the least overhead rating, the FEC transband central station processor 112' chooses the FEC transband remote station 106 that has first initialized communication with the FEC transband central station 104.

For instance, FIG. 8 shows an error correction block transmission sequence for three FEC transband remote stations 106 (FEC transband remote stations 1–3) that share a single downlink out-of-band time slot 111(1). For each downlink time frame 108, the amount of error correction overhead accumulated in the FEC transband central station 104 for each of FEC transband remote stations 1–3 is shown. The amount of accumulated error correction overhead is further divided into "gross overhead", i.e., the accumulated error correction data overhead at the end of a downlink time frame 108(1) taking into account no transmission of an error correction data packet during the shared downlink out-of-band time slot 109(1) of the downlink time frame 108, and "net overhead", i.e., the accumulated error correction data overhead at the end of that downlink time frame 108(1) taking into account the transmission of an error correction data packet during the shared downlink out-of-band time slot 109(1) of that downlink time frame 108. Each of FEC transband remote stations 1–3 has a 33⅓% overhead rating.

During downlink time frame 1, it is shown that the gross overhead with respect to FEC transband remote stations 1–3 is 100%, 33%, and 67%, respectively. Since the gross overhead with respect to FEC transband remote station 1 is the greatest, FEC transband remote station 1 would have been selected by the FEC transband central station processor in the previous downlink time frame 108 to receive an error correction data packet from the FEC transband central station 104 during time frame 1. At the beginning of downlink time frame 1, the FEC transband central station processor 112' selects FEC transband remote station 3 to receive an error correction data packet during downlink time frame 2, since the gross overhead with respect to FEC transband remote station 3 will be the greatest during time frame 2. During time frame 1, an error correction data packet having 100% overhead and comprising the error correction data accumulated with respect to FEC transband remote station 1 is transmitted to FEC transband remote station 1. As a result, the net overhead with respect to FEC transband remote station 1 changes from 100% to 0%, and the net overhead with respect to FEC transband remote stations 1 and 2 respectively remain unchanged at 33% and 67%.

During time frame 2, subsequent to the transmission of bearer data packets to respective FEC transband remote stations 1–3, 33% more overhead is accumulated with respect to each of the FEC transband remote stations 1–3, thus respectively creating a gross overhead of 33%, 67%, and 100% for FEC transband remote stations 1–3. During time frame 2, an error correction data packet having 100% overhead and comprising the error correction data accumulated with respect to FEC transband remote station 3 is transmitted to FEC transband remote station 3. As a result, the net overhead with respect, to FEC transband remote station 3 changes from 100% to 0%, and the net overhead with respect to FEC transband remote stations 1 and 2 respectively remain unchanged at 33% and 67%.

As shown in FIG. 8, by following the above-mentioned criteria, a cyclical pattern (FEC transband remote stations 1–3 receive error correction data packets in the following order: 1, 3, 2), which repeats every three time frames, begins at time frame 1. That is, FEC transband remote station 1 respectively receives error correction data packets during time frames 1, 4, 7, and so forth. FEC transband remote station 2 respectively receives error correction data packets during time frames 3, 6, 9, and so forth. FEC transband remote station 3 respectively receives error correction data packets during time frames 2, 5, 8, and so forth.

FIG. 9 shows an error correction data packet sequence wherein each of three FEC transband remote stations 106 (FEC transband remote stations 1–3) has a 20% overhead rating (for a total of 60%). As can be seen, the cyclical pattern is the same as that described above with respect to FIG. 8. The error correction data packets received by each of FEC transband remote stations 1–3, however, have 60% rather than 100% overhead.

FIG. 10 shows an error correction data packet sequence wherein three FEC transband remote stations 106 (FEC transband remote stations 1–3) respectively have a 20%, 50% and 10% overhead rating (for a total of 80%). As can be seen, a cyclical pattern (FEC transband remote stations 1–3 receive error correction data packets in the following order: 2, 1, 2, 2, 1, 2, 3), which repeats every seven time frames, beginning at time frame 6. That is, FEC transband remote station 1 respectively receives error correction data packets during time frames 7, 10, 14, 17, and so forth. FEC transband remote station 2 respectively receives error correction data packets during time frames 6, 8, 9, 11, 13, 15, 16, 18, and so forth. FEC transband remote station 3 respectively receives error correction data packets during time frames 12, 19, and so forth. The error correction data packets received by the FEC transband remote stations 1–3 vary. FEC transband remote station 1 receives error correction data packets that have either a 60% or 80% overhead. FEC transband remote station 2 receives error correction data packets that have either a 50% or 100% overhead. FEC transband remote station 3 receives error correction data packets that have a 70% overhead.

As shown in FIGS. 8, 9, and 10, the particular cyclical patterns created depend on the overhead rating of each of the FEC transband remote stations 106 that share a downlink out-of-band time slot 111(1).

Thus, the FEC transband central station processor 112' selects the particular FEC transband remote station 106 that receives an error correction data packet during a shared downlink out-of-band time slot 111(1) of the next downlink time frame 108(1) in accordance with the above criteria. In a similar manner, the FEC transband central station processor 112' selects the particular FEC transband remote station 106 that transmits an error correction data packet during a shared uplink out-of-band time slot 111(2) of the next uplink time frame 108(2). As the overhead required for a particular FEC transband remote station 106 to receive error correction data may differ from the overhead required for the particular FEC transband remote station 106 to transmit error correction data, the downlink error correction data packet sequence with respect to the particular FEC transband remote station 106 may differ from the uplink error correction data packet sequence with respect to the particular FEC transband remote station 106. Thus, the FEC transband remote station 106 may not necessarily transmit an error correction data packet during a particular uplink time frame 108(2) and receive an error correction data packet during a corresponding downlink time frame 108(1).

At step 158, the FEC transband central station 104 communicates with FEC transband remote stations 106 that are in current communication with FEC transband central station 104. During the current time frame pair 108(1)/(2), FEC transband central station 104 respectively transmits data to and receives data from these FEC transband remote stations 106 in the same manner as described above with respect to FIG. 4. That is, the FEC transband central station processor 112' accesses and obtains the current synchronization data and future synchronization data from the registers of the respective current sets of downlink bearer timing registers 140', uplink bearer timing registers 142', downlink FEC timing registers 144', and uplink FEC timing registers 146' comprising the identification data pertaining to each of the FEC transband remote stations 104.

In accordance with the current synchronization data, the FEC transband central station 104 transmits a bearer data packet, which is encoded with control data indicating the future synchronization data, to the respective FEC transband remote stations 106 during each of the designated in-band time slots 109(1) of the current downlink time frame 108(1), and receives a bearer data packet from the respective FEC transband remote stations 106 during each of the designated in-band time slots 109(2) of the current uplink time frame 108(2). In accordance with the current synchronization data, the FEC transband central station 104 transmits an error correction data packet to those respective FEC transband remote stations 106 designated to currently receive an error correction data packet during each of the designated out-of-band time slots 111(1) of the current downlink time frame 108(1), and receives an error correction data packet from those respective FEC transband remote stations 106 designated to currently transmit an error correction data packet during each of the designated out-of-band time slots 111(2) of the current uplink time frame 108(2).

At step 160, the FEC transband central station processor 112' carries the future synchronization data over to the current synchronization data in the pertinent registers in the sets of downlink bearer timing registers 140', uplink bearer timing registers 142', downlink FEC timing registers 144', and uplink FEC timing registers 146'.

At step 162, the FEC transband central station 104 transmits during a designated downlink broadcast time slot (not shown) of the next downlink time frames 108(2), data to FEC transband remote stations 106 that are not in current communication with the FEC transband central station 104. For instance, if an initiating FEC transband remote station 106 is requested to initiate communication with the FEC transband central station 104 during the previous uplink time frame 108(2), the FEC transband central station 104 sends a control signal to this FEC transband remote station 106 communicating future synchronization data to the FEC transband remote station 106 as described further below.

The wireless communications system 100 then returns to step 152, where the FEC transband central station 104 determines, during the beginning of the next time frame pairs 108(1)/(2), whether the system data overhead of the wireless communications system 100 should be changed.

If at step 152, the FEC transband central station 104 does receive a control signal from an FEC transband remote station 106 during the beginning of the current uplink window 108(2) seeking to initiate communication with the FEC transband central station 104, the FEC transband central station processor 112' accommodates the initiating FEC transband remote station 106 by selecting a future remote station assignment combination that supports the increased system data overhead.

At step 164, the FEC transband central station processor 112' accesses the sets of downlink time slot registers 148' and uplink time slot registers 150' to obtain data for each time slot 110 indicating the type of time slot 110, the identification and overhead rating of the FEC transband remote stations 106 currently assigned to the time slot 10, and the delay-sensitivity (by virtue of the delay-sensitivity of the input/output devices 114 respectively electrically coupled to FEC. transband remote stations 106) of the FEC transband remote stations 106 currently assigned to the time slot 110.

The future remote station assignment combination is determined at steps 166 and 168. At step 166, the initiating remote station 106 is assigned an unused time slot pair 110(1)/(2), as an in-band time slot pair 109(1)/(2). At step 168, the initiated remote station 106 is assigned an out-of-band time slot pair 111(1)/(2). Preferably, the initiating remote station 106 is assigned to a sub-out-of-band time slot pair 111(1)/(2)' (i.e., a currently used out-of-band time slot pair 111(1)/(2). In this manner, the number of out-of-band time slot pairs 111(1)/(2) used is minimized, which ultimately maximizes the number of unused time slot pairs 110(1)/(2) for future use as in-band time slot pairs 109(1)/(2). For example, if two remote stations 106 having respective overhead ratings of 40% and 30% are currently assigned to an out-of-band time slot pair 111(1)/(2)', an initiating remote station 106 having a 30% overhead rating can be assigned to that out-of-band time slot pair 111(1)/(2)' to create a total overhead of 100%, thereby fully utilizing that out-of-band time slot pair 111(1)/(2). It should be noted that assignment of an initiating remote station 106 to a sub-out-of-band time slot pair 111(1)/(2) should not be done in a manner that unduly degrades the communication quality of any delay-sensitive remote station 106 or exceeds central/remote station capabilities. That is, due consideration must be given to the fact that as the number of remote stations 106 assigned to a particular sub-out-of-band time slot pair 111(1)/(2)' increases, the delay incurred by each these remote stations 106 increases.

After the FEC transband central station processor 112' has determined the future remote station assignment combination (i.e., the time slot pair 110(1)/(2) assignments for the initiating and current FEC transband remote stations 106), the wireless communications system 100 goes to step 170, where the FEC transband central station processor 112' updates the set of downlink time slot registers 148' and the set of uplink time slot registers 150' with the revised time slot data, including revised data indicating the type of time slot 110, the identification and overhead rating of the FEC transband remote station 106 currently assigned to the time slot 110, and the delay-sensitivity of the FEC transband remote station 106 currently assigned to the time slot 110.

After the initiating FEC transband remote station 106 is assigned to an in-band time slot pair 109(1)/(2), or if the FEC transband central station 104 never received a control signal from an FEC transband remote station 106 seeking to initiate communication with the FEC transband central station 104, the wireless communications system 100 then goes to step 152 whereat the FEC transband central station 104 determines during the current time frame pair 108(1)/(2) whether an FEC transband remote station 106, currently in communication with the FEC transband central station 104, seeks to terminate communication with the FEC transband central station 104.

If at step 152, the FEC transband central station 104 receives a control signal from an FEC transband remote station 106 seeking to terminate communication with the FEC transband central station 104, the FEC transband central station accommodates the termination of the FEC transband remote station 106 by selecting a future remote station assignment combination that maximizes the amount of unused time slot pairs 110(1)/(2) available to be used as in-band time slot pairs 109(1)/(2) by terminating assignment of the remote station 106 from the in-band time slot pair 110(1)/(2) and out-of-band time slot pair 111(1)/(2) to which it was previously assigned, and if necessary, altering the current assignment of remote station 106 to out-of-band time slot pairs 111(1)/(2) without exceeding central/remote station capabilities.

At step 172, the FEC transband central station processor 112' accesses the sets of downlink time slot registers 148' and uplink time slot registers 150' to obtain data for each time slot 110 indicating the type of time slot 110, the identification and overhead rating of the FEC transband remote stations 106 currently assigned to the time slot 110, and the delay-sensitivity of FEC transband remote stations 106 currently assigned to the time slot 110.

The future remote station assignment combination is determined at steps 174 and 176. At step 174, the assignment of the terminating FEC transband remote station 106 is terminated from the in-band time slot pair 109(1)/(2) creating an unused time slot pair 110(1)/(2) from the vacated in-band time slot pair 109(1)/(2).

At step 176, the assignment of the terminating FEC transband remote station 106 is terminated from the out-of-band time slot pair 111(1)/(2). An unused time slot pair 110(1)/(2) is created from the vacated out-of-band time slot pair 111(1)/(2) if the terminating FEC transband remote station 106 previously assigned to the vacated out-of-band time slot pair 111(1)/(2) was the sole FEC transband remote station 106, i.e., the terminating FEC transband remote station 106 did not employ a sub-out-of-band time slot pair 111(1)/(2). If the terminating FEC transband remote station 106 did employ a sub-out-of-band time slot pair 111(1)/(2) (i.e., the out-of-band time slot pair 111(1)/(2) was shared by other FEC transband remote stations 106), the termination of the FEC transband remote station 106 decreases the overhead that is currently supported by that out-of-band time slot pair 111(1)/(2). In this case, the overhead that would be freed up may be used by current remote station 106, allowing an out-of-band time slot pair 111(1)/(2) to be vacated and become an unused time slot pair 110(1)/(2).

Thus, the remaining remote stations 106 are reassigned if such reassignment allows an unused time slot pair 110(1)/(2) to be created from a previously occupied out-of-band time slot pair 111(1)/(2). For example, if two remote stations 106, each having a 40% overhead rating, share a sub-out-of-band time slot pair 111(1)/(2), and one of these remote stations 106 are terminated, a remote station 106 or remote stations 106 having a total overhead rating of up to 60% can be reassigned from an out-of-band time slot pair 111(1)/(2) to this sub-out-of-band time slot pair 111(1)/(2)', thereby allowing an unused time slot pair 110(1)/(2) to be created from the out-of-band time slot pair 111(1)/(2). Again, it should be noted that reassignment of remote stations 106 to sub-out-of-band time slot pairs 111(1)/(2) should not be done in a manner that unduly degrades the communication quality of any delay-sensitive remote station 106 or exceeds central/remote station capabilities.

After the FEC transband central station processor 112' has determined the time slot pair 110(1)/(2) reassignments for current FEC transband remote stations 106, the wireless communications system 100 goes to step 178, whereat the FEC transband central station processor 112' updates the set of downlink time slot registers 148' and the set of uplink time slot registers 148' and the set of uplink time slot registers 150' with the revised time slot data, including revised data indicating the type of time slot 110, the identification and overhead rating of FEC transband remote stations 106 currently assigned to time slot 110, and the delay-sensitivity of the FEC transband remote stations 106 currently assigned to time slot 110.

After communication between the FEC transband remote station 106 and the FEC transband central station 104 is terminated, or if the FEC transband central station 104 never received a control signal from an FEC transband remote station 106 seeking to terminate communication with the FEC transband central station 104, the wireless communications system 100 then goes to step 152, whereat the FEC transband central station 104 determines during the current time frame pair 108(1)/(2) whether an FEC transband remote station 106 currently in communication with the FEC transband central station 104 seeks to adjust its overhead rating.

If the FEC transband central station 104 receives a control signal from an FEC transband remote station 106 seeking to adjust its overhead rating, the FEC transband central station processor 112' accommodates the alteration of the overhead rating by selecting a future remote station assignment combination that, if the overhead increases, supports the increased system data overhead, and if the overhead decreases, maximizes the amount of unused time slot pairs 110(1)/(2) available to be used as in-band time slot pairs 109(1)/(2) by, if necessary, altering the current assignment of remote stations 106 to out-of-band time slot pairs 111(1)/(2).

At step 180, the FEC transband central station processor 112' accesses the sets of downlink time slot registers 148' and uplink time slot registers 150' to obtain data for each time slot 110 indicating the type of time slot 110, the identification and overhead rating of the FEC transband remote stations 106 currently assigned to the time slot 110, and the delay-sensitivity of the FEC transband remote stations 106 currently assigned to the time slot 110.

The future remote station assignment combination is determined at steps 182, 184 and 186. At step 182, the FEC transband central station processor 112' first determines whether the overhead altering FEC transband remote station 106 requests an increase in overhead rating or a decrease in overhead rating. If the overhead altering FEC transband remote station 106 requests a decrease in its overhead rating, the overhead of the out-of-band time slot pair 111(1)/(2) to which the remote station 106 is currently assigned decreases. Thus, at step 184, the remote stations 106 are reassigned if such reassignment allows an unused time slot pair 110(1)/(2) to be created from a previously occupied out-of-band time slot pair 111(1)/(2). For example, if two remote stations 106, each having a 40% overhead rating, share a sub-out-of-band time slot pair 111(1)/(2), and the overhead rating of one of these remote stations 106 decreases to 20%, a remote station 106 or remote stations 106 having a total overhead rating of up to 40% can be reassigned from an out-of-band time slot pair 111(1)/(2) to this sub-out-of-band time slot pair 111(1)/(2)', thereby allowing an unused time slot pair 110(1)/(2) to be created from the out-of-band time slot pair 111(1)/(2).

If the overhead altering FEC transband remote station 106 at step 180 requests an increase in its overhead rating, the overhead of the out-of-band time slot pair 111(1)/(2) to which the remote station 106 is currently assigned increases. Thus, at step 186, if the remote station 106 requesting an increase in its overhead rating is currently assigned to a sub-out-of-band time slot pair 111(1)/(2), and the increase in overhead will exceed the overhead capacity of the sub-out-of-band time slot pair 111(1)/(2)', the remote station 106 will be assigned to another out-of-band time slot pair 111(1)/(2) or sub-out-of-band time slot pair 111(1)/(2)'. For example, if two remote stations 106, each having a 40% overhead rating, share a sub-out-of-band time slot pair 111(1)/(2), and the overhead rating of one of these remote stations 106 increases to 80%, this remote station 106 can be reassigned to a sub-out-of-band time slot pair 111(1)/(2)' to which a remote station 106 or remote stations 106 having a total overhead rating of up to 20% is currently assigned.

After the FEC transband central station processor 112' has determined the time slot pair 110(1)/(2) assignments for current FEC transband remote stations 106, the wireless communications system 100 goes to step 188, whereat the FEC transband central station processor 112' updates the set of downlink time slot registers 148' and the set of uplink time slot registers 150' with the revised time slot data, including revised data indicating the type of time slot 110, the identification and overhead rating of the FEC transband remote station 106 currently assigned to the time slot 110, and the delay sensitivity of the FEC transband remote stations 106 currently assigned to the time slot 110.

The wireless communication system 100 then goes to steps 154 to 162 whereat communication between FEC transband central stations 104 and FEC transband remote stations 106 is provided. Steps 154 to 162 are performed in a similar manner described above with the exception that, at step 156, the wireless communications system 100 takes into account the change in the system data overhead when determining the future synchronization data in the respective sets of downlink bearer timing registers 140', uplink bearer timing registers 142', downlink FEC timing registers 144', and uplink FEC timing registers 146'.

When the wireless communications system 100 is at step 156, subsequent to the initiation of an FEC transband remote station 106, the FEC transband central station processor 112' selects a currently unused register in each of these sets of registers and stores identification data pertaining to the initiating FEC transband remote station 106 therein. The FEC transband central station processor 112' then stores future synchronization data in the registers of the respective sets of downlink bearer timing registers 140', uplink bearer timing registers 142', downlink FEC timing registers 140' and uplink FEC timing registers 142' pertaining to the remote stations 106, taking into account the change in system overhead.

That is, due to the initiation of a remote station 106, and thus, subsequent increase in the system data overhead, the cyclical pattern of the error correction data packet sequence is altered. For example, FIG. 11 shows an error correction data packet sequence wherein three FEC transband remote stations 106 (FEC transband remote stations 1–3) respectively having a 20%, 50% and 10% overhead rating and have achieved a cyclical pattern, which begins at time frame 6 and repeats every seven time frames (i.e., FEC transband remote stations 1–3 receive error correction data packets in the following order: 2,1,2,2,1,2,3). If an initiating FEC transband remote station (FEC transband remote station 4) having a 20% overhead begins communicating at time frame 20, the cyclical pattern changes thusly. Beginning at time frame 28 and repeating every ten time frames, FEC transband remote stations 1–4 receive error correction data packets in the following order: 4,2,1, 2,2,4,2,1,2,3.

When the wireless communications system 100 is at step 156, subsequent to the termination of an FEC transband remote station 106, the FEC transband central station processor 112' deletes any identification data and current and future synchronization data in the register of each of the sets of downlink bearer timing registers 140', uplink bearer timing registers 142', downlink FEC timing registers 144', and uplink FEC timing registers 146' that pertain to the terminating FEC transband remote station 106. The FEC transband central station processor 112' then stores future synchronization data in the registers of the respective sets of downlink bearer timing registers 140', uplink bearer timing registers 142', downlink FEC timing registers 140' and uplink FEC timing registers 142' pertaining to the remote stations 106, taking into account the change in system overhead.

That is, due to the termination of an FEC transband remote station 106, and thus, subsequent decrease in the system data overhead, the cyclical pattern of the error correction data packet sequence is altered. For example, FIG. 12 shows an error correction data packet sequence wherein three FEC transband remote stations 106 (FEC transband remote stations 1–3) respectively have a 20%, 50% and 10% overhead rating and have achieved a cyclical pattern, which begins at time frame 6 and repeats every seven time frames (i.e., FEC transband remote stations 1–3 receive error correction data packets in the following order: 2,1,2,2,1,2,3). If an FEC transband remote station (FEC transband remote station 3) having a 10% overhead terminates communication with FEC transband central station 104 at time frame 20, the cyclical pattern changes thusly. Beginning at time frame 22 and repeating every three time frames, FEC transband remote stations 1–2 receive error correction data packets in the following order: 2,2,1.

When the wireless communications system 100 is at step 156, subsequent to the alteration of the overhead rating of an FEC transband remote station 106, the FEC transband central station processor 112' stores future synchronization data in the registers of the respective sets of downlink bearer timing registers 140', uplink bearer timing registers 142', downlink FEC timing registers 140' and uplink FEC timing registers 142' pertaining to the initiating remote station 106 and the current remote stations 106, taking into account the change in system overhead.

That is, due to the alteration of the remote station 106 overhead rating, and thus, subsequent alteration of the system data overhead, the cyclical pattern of the error correction data packet sequence is altered. For example, FIG. 13 shows an error correction data packet sequence wherein three FEC transband remote stations 106 (FEC transband remote stations 1–3) respectively have a 20%, 50% and 10% overhead rating and have achieved a cyclical pattern, which begins at time frame 6 and repeats every seven time frames (i.e., FEC transband remote stations 1–3 receive error correction data packets in the following order: 2,1,2,2,1,2,3). If the overhead rating of FEC transband remote station 2 is changed from 50% to 20% at time frame 20, the cyclical pattern changes thusly. Beginning at time frame 22 and repeating every eight time frames, FEC transband remote stations 1–2 receive error correction data packets in the following order: 2,3,1,2,1,3,2,1.

The wireless communications system 100 can be operated in a TDMA/TDD format in a similar manner as described above with the exception that a single downlink/uplink time frame 108(3) is employed rather than a uplink/downlink time frame pair 108(1)/(2). The wireless communications system 100 can also be operated in a unilateral mode, rather than the bilateral mode described above. That is, bearer data packets and error correction packets are transmitted between the FEC transband central station 104 and FEC transband remote stations 106 either as a downlink transmission or an uplink transmission but not both.

The present inventions are not limited to the wireless communication system disclosed above and may include other types of wireless communications systems, such as, e.g., satellite-based communications systems, or other types of wire-based systems, such as, e.g., LAN systems or fiber optic networks.

Thus, an improved apparatus and method for improving the data throughput of a communications system is disclosed. While embodiments and applications of this invention have been shown and described, it would be apparent to those skilled in the art that many more modifications are possible without departing from the inventive concepts herein. The invention, therefore, is not to be restricted except in the spirit of the appended claims.

What is claimed:

1. A method of operating a wireless communications system having a system data overhead, the system comprising an FEC transband central station and a plurality of remote stations, the method comprising:
   dividing a plurality of time frames into a plurality of time slots, said plurality of time slots comprising in-band time slots and out-of-band time slots, each of said plurality of remote stations being assigned to an in-band time slot and an out-of-band time slot to create a current remote station assignment combination;
   altering said system data overhead; and
   selecting a future remote station assignment combination in response to said alteration of said system data overhead.

2. The method of claim 1, wherein said FEC transband central station is a wireless communications base station and any FEC transband remote stations in communication with said wireless communications base station is a wireless communications mobile handset.

3. The method of claim 1, wherein said selected remote station assignment combination maximizes the number of unused time slots.

4. The method of claim 1, wherein said selected remote station assignment combination does not unduly degrade the communication quality of said plurality of FEC transband remote stations.

5. The method of claim 1, further comprising:
   initiating communication between said FEC transband central station and an FEC transband remote station; and
   assigning said initiating FEC transband remote station to an in-band time slot and an out-of-band time slot in accordance with said selected future remote station assignment combination.

6. The method of claim 5, wherein said initiating FEC transband remote station is assigned to a sub-out-of-band time slot.

7. The method of claim 1, further comprising:

terminating communication between said FEC transband central station and one of said plurality of remote stations to create a vacated in-band time slot and vacated out-of-band time slot; and creating an unused time slot from said vacated in-band time slot in accordance with said selected remote station assignment combination.

8. The method of claim 7, further comprising:

creating an unused time slot from said vacated out-of-band time slots in accordance with said selected remote station assignment combination.

9. The method of claim 7, further comprising:

reassigning one of said plurality of remote stations to said vacated out-of-band time slot in accordance with said selected remote station assignment combination.

10. The method of claim 1, further comprising:

adjusting the error correction data overhead rating of an overhead altering FEC transband remote station;

assigning said plurality of FEC transband remote stations to said plurality of out-of-band time slots in accordance with said selected remote station assignment combination; and reassigning at least one of said plurality of FEC transband remote stations to at least one of said plurality of out-of-band time slots.

11. The method of claim 10, wherein said error correction data overhead rating is increased, and wherein said overhead altering FEC transband remote station is reassigned to another of said plurality of out-of-band time slots.

12. The method of claim 10, wherein said error correction data overhead rating is decreased, and wherein one of said plurality of FEC transband remote stations is reassigned to an out-of-band time slot to which said overhead altering FEC transband remote station is assigned.

* * * * *

UNITED STATES PATENT AND TRADEMARK OFFICE
CERTIFICATE OF CORRECTION

PATENT NO.   : 6,557,142 B2
DATED        : April 29, 2003
INVENTOR(S)  : Morris et al.

It is certified that error appears in the above-identified patent and that said Letters Patent is hereby corrected as shown below:

<u>Column 23,</u>
Line 17, delete "10", insert -- 110 --.

Signed and Sealed this

Sixteenth Day of September, 2003

JAMES E. ROGAN
*Director of the United States Patent and Trademark Office*